United States Patent
Pace et al.

(10) Patent No.: US 9,924,613 B2
(45) Date of Patent: Mar. 20, 2018

(54) MODULAR ELECTRONIC PRODUCTION EQUIPMENT SUPPORT STRUCTURES, MODULE CONNECTORS AND MODULES THEREFOR, AND RELATED INSTALLATIONS AND METHODS

(71) Applicant: Revolution Display LLC, Glendale, CA (US)

(72) Inventors: Vincent M. Pace, Sherman Oaks, CA (US); Patrick Campbell, Canyon Country, CA (US)

(73) Assignee: Revolution Display, LLC, Glendale, CA (US)

( * ) Notice: Subject to any disclaimer, the term of this patent is extended or adjusted under 35 U.S.C. 154(b) by 0 days.

(21) Appl. No.: 15/148,829

(22) Filed: May 6, 2016

(65) Prior Publication Data
US 2016/0330862 A1    Nov. 10, 2016

Related U.S. Application Data

(60) Provisional application No. 62/158,349, filed on May 7, 2015, provisional application No. 62/159,035, filed on May 8, 2015.

(51) Int. Cl.
*H05K 7/18* (2006.01)
*A47B 47/00* (2006.01)
(Continued)

(52) U.S. Cl.
CPC .......... *H05K 7/18* (2013.01); *A47B 47/0091* (2013.01); *A47B 97/00* (2013.01); *F16M 11/42* (2013.01);
(Continued)

(58) Field of Classification Search
CPC ...... H05K 7/18; H05K 5/0217; H05K 5/0021; G09F 9/3026; A47B 47/0091;
(Continued)

(56) References Cited

U.S. PATENT DOCUMENTS 2,345,650 A    4/1944   Attwood
2,579,685 A *  12/1951  Loose .................. B65D 19/385
                                                    108/53.5
(Continued)

FOREIGN PATENT DOCUMENTS

WO    2008112152 A1    9/2008

OTHER PUBLICATIONS

Extended European Search Report dated Sep. 20, 2016, in connection with European Application No. 16168610.0 (Pace et al.).
(Continued)

*Primary Examiner* — Stanton L Krycinski
(74) *Attorney, Agent, or Firm* — Downs Rachlin Martin PLLC

(57) ABSTRACT

Stackable modules and systems of stackable modules for making electronic production equipment furniture for use in mobile and/or non-mobile production facilities. Each stackable module includes one or more types of connection members that allow the module to be securely connected to another stackable module when the modules are stacked with one another for deployment and/or shipping. In some embodiments, quick-connect pins are used to secure the modules together via corresponding sets of the connection members on adjacent ones of the modules. The stackable modules are provided in differing shapes and configurations, some of which are for specific pieces of electronic equipment and others of which can accommodate any of a variety of pieces of electronic equipment. Stackable modules and production furniture made therewith can have numerous
(Continued)

benefits, including, relative ease of shipping, ease of set up and tear down, and reconfigurability to suit differing needs.

16 Claims, 13 Drawing Sheets

(51) Int. Cl.
*A47B 97/00* (2006.01)
*F16M 11/42* (2006.01)
*H05K 5/00* (2006.01)
*H05K 5/02* (2006.01)
*F16M 13/00* (2006.01)
*G09F 9/302* (2006.01)

(52) U.S. Cl.
CPC ........... *F16M 13/00* (2013.01); *G09F 9/3026* (2013.01); *H05K 5/0021* (2013.01); *H05K 5/0217* (2013.01); *A47B 2097/005* (2013.01); *A47B 2200/0078* (2013.01)

(58) Field of Classification Search
CPC ............ A47B 97/00; A47B 2200/0078; A47B 2097/005; F16M 11/42; F16M 13/00
USPC .......................................... 206/512
See application file for complete search history.

(56) References Cited

U.S. PATENT DOCUMENTS

| | | | |
|---|---|---|---|
| 2,696,139 A | 12/1954 | Attwood | |
| 2,737,268 A | 3/1956 | Smith | |
| 2,767,951 A | 10/1956 | Cousino | |
| 2,928,704 A | 3/1960 | Rappaport | |
| 2,943,897 A | 7/1960 | Johnson et al. | |
| 3,000,680 A * | 9/1961 | Zelenko | A47B 87/02 206/512 |
| 3,077,960 A | 2/1963 | Lang | |
| 3,082,711 A | 3/1963 | Vetere | |
| 3,190,710 A | 6/1965 | Freeman | |
| 3,256,671 A | 6/1966 | Handley | |
| 3,378,320 A * | 4/1968 | Morgan | A47B 47/03 174/560 |
| 3,556,456 A * | 1/1971 | Lunde | B65D 90/0006 206/512 |
| 3,636,893 A * | 1/1972 | Lange | A47B 47/0091 108/101 |
| 4,261,470 A | 4/1981 | Dolan | |
| 4,626,155 A * | 12/1986 | Hlinsky | B60P 7/132 114/75 |
| 4,681,378 A | 7/1987 | Hellman, III | |
| 4,993,125 A * | 2/1991 | Capron | B65D 90/0006 24/287 |
| 4,997,240 A | 3/1991 | Schmalzl et al. | |
| D323,259 S * | 1/1992 | Evans | D6/675.3 |
| 5,165,770 A | 11/1992 | Hahn | |
| D339,571 S | 9/1993 | Drabczyk et al. | |
| 5,257,440 A * | 11/1993 | Bardou | B65D 90/0026 220/1.5 |
| 5,312,005 A | 5/1994 | Odell | |
| D348,960 S | 7/1994 | McCaffrey | |
| 5,609,402 A * | 3/1997 | Kemp | A47B 13/06 211/94.01 |
| 5,980,160 A * | 11/1999 | Vanderklaauw | B66F 1/00 182/178.1 |
| 5,992,953 A * | 11/1999 | Rabinovitz | A47B 87/02 312/111 |
| 6,152,553 A * | 11/2000 | Wunderlich | A47B 47/0091 108/110 |
| 6,167,670 B1 | 1/2001 | Reite et al. | |
| 6,732,660 B2 | 5/2004 | Dame et al. | |
| 6,926,375 B2 * | 8/2005 | Nagamine | G09F 9/00 312/111 |
| 6,990,909 B2 * | 1/2006 | Gosling | A47B 83/001 108/50.02 |
| 7,063,449 B2 | 6/2006 | Ward | |
| 7,774,968 B2 * | 8/2010 | Nearman | G09F 9/30 292/240 |
| 7,901,018 B2 | 3/2011 | Baughman | |
| 7,997,213 B1 * | 8/2011 | Gauthier | B65D 88/022 108/53.1 |
| 8,007,121 B2 | 8/2011 | Elliott et al. | |
| 8,172,097 B2 | 5/2012 | Nearman et al. | |
| 8,172,098 B2 | 5/2012 | Eustace et al. | |
| 8,369,103 B2 * | 2/2013 | Mitsuhashi | F16M 13/02 248/917 |
| 8,944,393 B2 * | 2/2015 | Mitsuhashi | G09F 7/18 248/220.22 |
| 8,985,716 B2 * | 3/2015 | Lundrigan | A47B 87/0284 211/189 |
| 9,198,324 B1 * | 11/2015 | Yousif | H05K 7/18 |
| 9,429,825 B2 * | 8/2016 | Dundee | G03B 21/54 |
| 9,456,688 B2 * | 10/2016 | Moyer | A47B 47/0091 |
| 9,532,484 B2 * | 12/2016 | Franklin | H05K 7/1495 |
| 2002/0153335 A1 | 10/2002 | Robideau | |
| 2004/0233125 A1 | 11/2004 | Tanghe et al. | |
| 2005/0201087 A1 | 9/2005 | Ward | |
| 2007/0000849 A1 | 1/2007 | Lutz et al. | |
| 2007/0176854 A1 | 8/2007 | Ward et al. | |
| 2007/0218751 A1 | 9/2007 | Ward | |
| 2011/0174753 A1 | 7/2011 | Pinto et al. | |
| 2012/0062540 A1 * | 3/2012 | Quadri | G09F 9/3026 345/211 |
| 2012/0120033 A1 | 5/2012 | Mittan et al. | |
| 2014/0239139 A1 | 8/2014 | Opsomer | |
| 2015/0266616 A1 * | 9/2015 | Barrable | B65D 88/022 206/512 |

OTHER PUBLICATIONS

TVTechnology—"A New Generation Production Truck," http://www.tvtechnology.com/prntarticle.aspx?articleid=204210 (Last viewed on Apr. 20, 2015).

* cited by examiner

FIG. 6
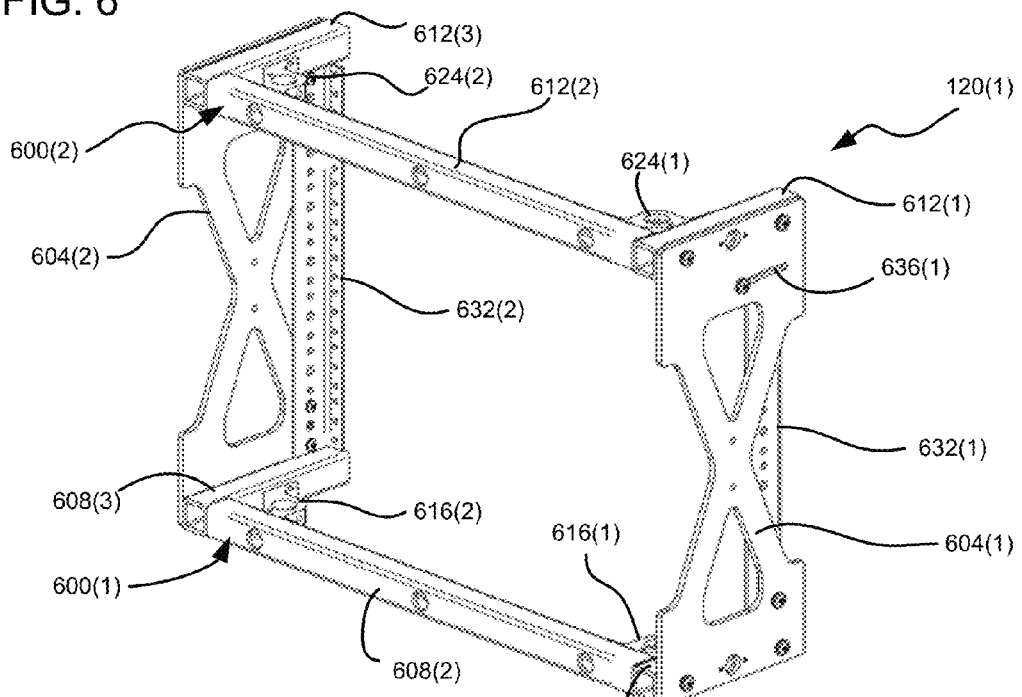
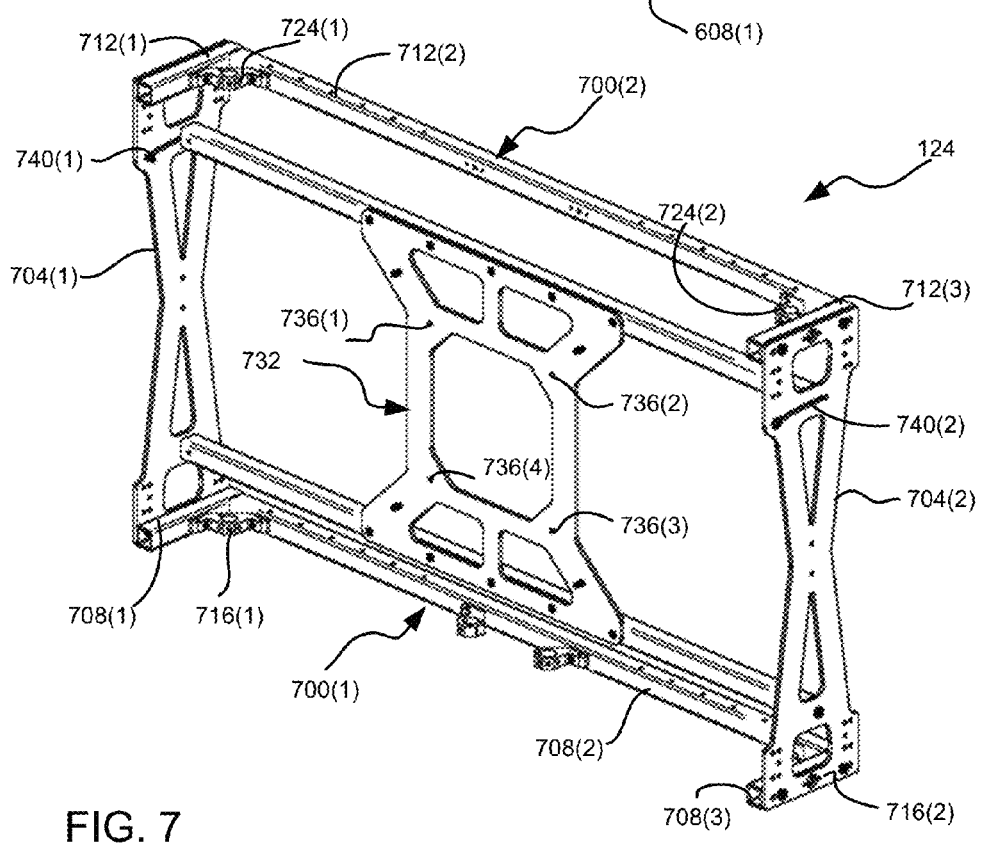
FIG. 7

MODULAR ELECTRONIC PRODUCTION EQUIPMENT SUPPORT STRUCTURES, MODULE CONNECTORS AND MODULES THEREFOR, AND RELATED INSTALLATIONS AND METHODS

RELATED APPLICATION DATA

This application claims the benefit of priority of U.S. Provisional Patent Application Ser. No. 62/158,349 filed on May 7, 2015, and titled "MODULAR ELECTRONIC PRODUCTION EQUIPMENT SUPPORT STRUCTURES, MODULE CONNECTORS AND MODULES THEREFOR, AND RELATED INSTALLATIONS AND METHODS." This application also claims the benefit of priority of U.S. Provisional Patent Application Ser. No. 62/159,035 filed on May 8, 2015, and titled "MODULAR ELECTRONIC PRODUCTION EQUIPMENT SUPPORT STRUCTURES, MODULE CONNECTORS AND MODULES THEREFOR, AND RELATED INSTALLATIONS AND METHODS. Each of these applications is incorporated herein by reference in its entirety.

FIELD OF THE INVENTION

The present invention generally relates to the field of video production equipment. In particular, the present invention is directed to modular electronic video production equipment support structures, module connectors and modules therefor, and related installations and methods.

BACKGROUND

Video production requires a slew of equipment, such as production consoles, graphics consoles, AD consoles, HD switchers, monitors, video routers, audio routers, encoders/decoders, receiver decoders, signal amplifiers, and satellite transmitters. A significant portion of video production is done remotely, requiring a substantial amount of production equipment integrated together to produce a show, such as a broadcast of a sporting event, broadcast of an award show, or broadcast of political debate, among many others. Current methods of deploying production equipment include packaging this equipment in a mobile production unit, such as mobile production truck or trailer, that is designed specifically for a particular type of show or event. Some mobile production units are designed for multiple event types. In either case, mobile production units are typically outfitted with custom equipment furniture and racks that are both typically of the enclosure type made of welded members and panels.

Another method of deploying production equipment is to package the equipment in flight packs. A flight pack is a custom case designed to ship the equipment to a location for assembly on site. With flight packs, the equipment is designed to be broken down into sizes that accommodate normal air freight shipping methods. When flight packs arrive on location, the equipment must be assembled into a production-friendly format to be used. One method of reducing the time of setup on location is to weld-up frames that support the equipment as it will be used in the field. The configuration of the equipment in use for production and the configuration of the equipment in shipment are very different. Equipment that is shipped the same way it will be used can be 50% greater in size and 50% greater in weight, making shipping cost prohibitively expensive. The phrase often used is: "Production will accept the worst mobile production unit before it accepts the best flight pack".

SUMMARY OF THE DISCLOSURE

In one implementation, the present disclosure is directed to a modular equipment support system designed and configured to support electronic equipment. The modular equipment support system includes a plurality of stackable modules designed and configured to be stacked on, and secured to, one another to create at least one piece of production equipment furniture, each of the stackable modules including: a stackable frame having an upper end and a lower end, each designed and configured to engage, respectively, a lower end or an upper end of another of the stackable modules when the modules are stacked on one another; at least one upper module-connecting member secured to the stackable frame on the upper end, the upper module-connecting member including a first connector-pin receiver designed and configured to receive a first portion of a connector pin; and at least one lower module-connecting member secured to the stackable frame on the lower end, the lower module-connecting member including a second connector-pin receiver designed and configured to receive a second portion of the connector pin; wherein the stackable modules are designed and configured so that, when a first stackable module of the plurality of stackable modules is properly stacked on a second stackable module of the plurality of stackable modules, the second connector-pin receiver of the first stackable module and the first connector-pin receiver of the second stackable module are in registration with one another so that a user can install the connector pin so that the first and second portions of the connector pin are located, respectively, in the first and second receivers.

In another implementation, the present disclosure is directed to a set of module-connecting members designed and configured to be secured to frame members of production furniture modules and to secure the production-furniture modules to one another. The set of module-connecting members includes a first module-connecting member that includes first and second ends having, respectively, first and second faces lying in corresponding respective planes orthogonal to one another, each of the first and second faces designed and configured to secure the first module-connecting member to a first pair of horizontal frame members connected together at a right-angle corner of a first production furniture module, wherein the first and second ends are mirror images of one another and each includes a fastener receiver designed, configured, and located relative to a corresponding fastener receiver on the production-furniture module to receive a fastener for securing the first module-connecting member to one or the other of the pair of horizontal frame members; and a first central portion located between the first and second ends and including a first pin receiver designed and configured to snugly receive a vertical connector pin when the first module connecting member is deployed in module production furniture for use.

In yet another implementation, the present disclosure is directed to a piece of production furniture designed and configured to support one or more pieces of electronic equipment during use of the electronic equipment. The piece of production furniture includes a first stackable module that includes a first stackable frame; and a first module-connecting member secured to the first stackable frame; a second stackable module that includes: a second stackable frame; and a second module-connecting member secured to the second stackable frame; a connector pin; and a retainer;

wherein: at least one of the first and second module-connecting members includes a first pin receiver designed and configured to conformally receive the connector pin; the second stackable frame is stacked onto the first stackable frame so that the first and second module-connecting members are positioned relative to one another so that the connector pin is in proper alignment with the pin receiver; the connector pin is engaged with both of the first and second module-connecting members and conformally engaged with the pin receiver; and the retainer is installed so as to retain the connector pin in engagement with the pin receiver.

In still another implementation, the present disclosure is directed to a production equipment installation, which includes a support structure, comprising a first module that includes a first stackable frame; and a first module-connecting member secured to the first stackable frame; a second module that includes: a second stackable frame; and a second module-connecting member secured to the second stackable frame; a connector; and a retainer; wherein: at least one of the first and second module-connecting members includes a connector receiver designed and configured to conformally receive the connector; the connector is engaged with both of the first and second module-connecting members and conformally engaged with the connector receiver; the second stackable frame is stacked onto the first stackable frame so that the first and second module-connecting members are positioned relative to one another so that the connector is in proper alignment with the connector receiver; and the retainer is installed so as to retain the connector in engagement with the connector receiver; and at least one piece of electronic production equipment supportingly engaged with the support structure.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein:

FIG. 6 is an enlarged isometric view of one of the small-monitor modules of the piece of modular production furniture of FIG. 1;

FIG. 7 is an enlarged isometric view of the large-monitor module of the piece of modular production furniture of FIG. 1;

DETAILED DESCRIPTION

General Description

Figure 1:
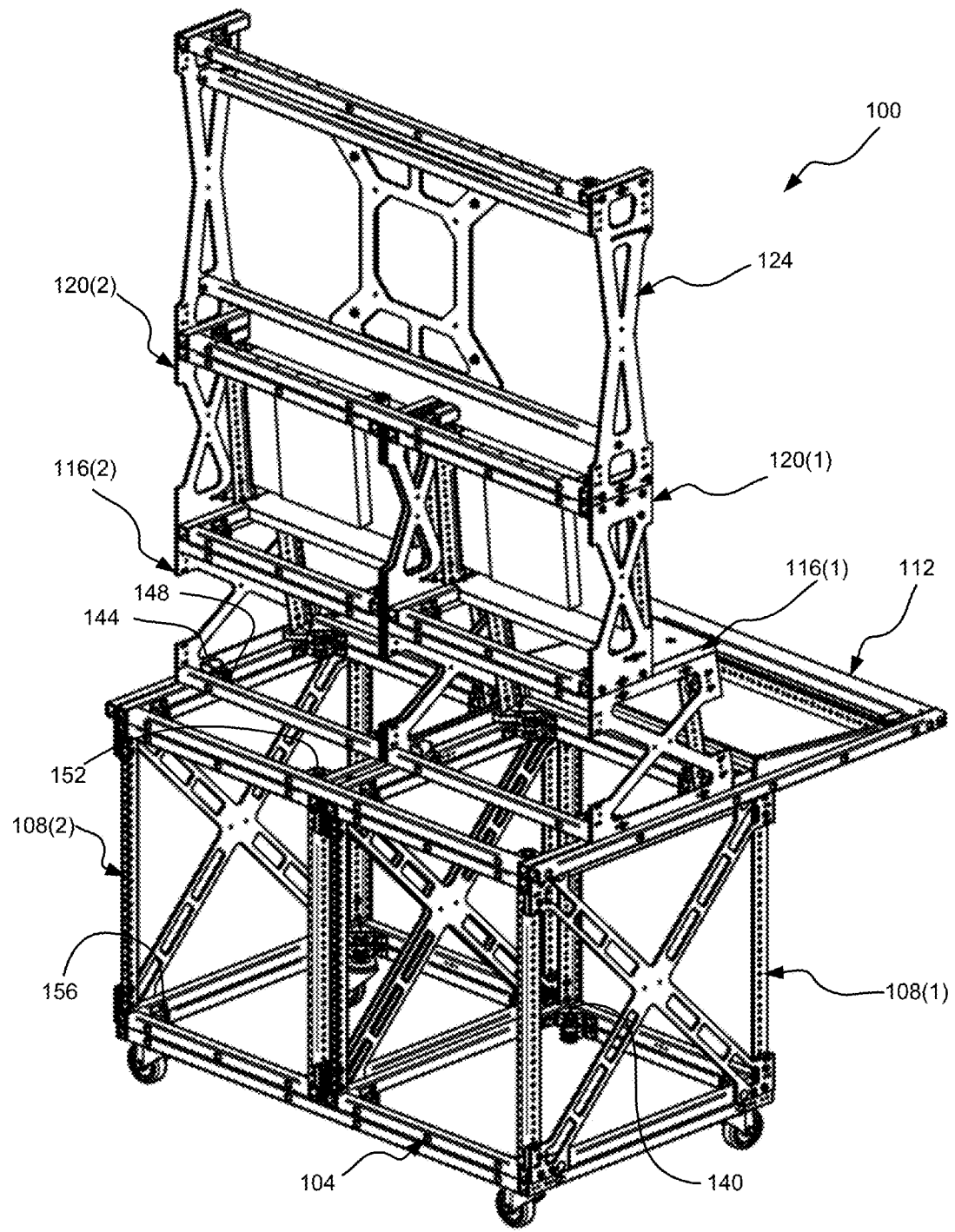
FIG. 1 is an isometric view of an exemplary piece of modular production furniture made in accordance with the present invention.

In some aspects, the present invention is directed to modularization of production equipment support structures, such as console bases, production stations, monitor "walls," and racks, among others, for supporting any of a wide variety of electronic equipment used for video production, such as production workstations, graphics consoles, AD consoles, HD video switchers, monitors, video routers, audio routers, encoders/decoders, receiver decoders, signal amplifiers, and satellite transmitters, among others (referred to collectively herein and in the appended claims as "electronic production equipment"). It is noted that while video production is a focus of many embodiments of the present invention, various features and aspects of the present invention can be used for other types of production, such as mobile light production and/or sound production for virtually any sort of event, including, but not limited to, music performances (concerts, festivals, etc.) and similar events. The term "production" is used herein and in the appended claims to refer to any one or more to the various types of production that can benefit from features and aspects of the present invention, such as video production, audio production, and visual display production (such as lighting production and onstage graphics production), among others. In addition and for convenience, production equipment support structures made using the modularization disclosed herein, including all of the examples listed above in this paragraph, is referred to as "production furniture" herein and in the appended claims.

In some embodiments, the modularization is effected using connection components that allow for quick assembly of such production furniture from sets of stackable modules. It is noted that the term "stackable" and like terms as used herein denote that the modules can be stacked vertically, with each lower stackable module supporting the stackable module(s) stacked on it. In some instantiations, each stackable module is outfitted with two or more module-connecting members in locations on each stackable module such that, when the modules are properly stacked, the module-connecting members on one module confront the module-connecting members on the other module in proper alignment with one another. When the confronting module-connecting members are properly aligned, a worker can secure the modules to one another via one or more removable connectors at each confronting pair of module-connecting members. By repeating the stacking and connecting process with multiple ones of the same and/or other types of stackable modules, a worker can build any of a wide variety of production furniture, in some cases along with additional modularized components, such as dolly modules, tabletop modules, console support modules, shelves, and stabilizers, among others.

It is noted that in some cases production equipment can be preinstalled into or onto one or more of the stackable modules prior to stacking and assembly of the production furniture and/or prior to shipping or otherwise moving the furniture, whereas in other cases the production equipment can be installed into or onto the corresponding stackable module(s) after the modules have been stacked and/or connected together. When production equipment is preinstalled into any stackable module, it can be the case that the module is shipped with the production equipment installed to reduce the time it takes to set up and break down production installations. As will be seen below, in some cases, certain types of modular production furniture, such as production furniture composed at least partially of monitor support modules and intermediate equipment support modules, are designed and configured in conjunction with one another to have an in-use configuration and a different shipping configuration that is more compact than the in-use configuration to reduce shipping volume. In some cases, the production equipment can remain installed in or on one or more of the stackable modules when the production furniture is in the shipping configuration to reduce the amount of time it takes a worker to prepare the production furniture for use. An example of a set of stackable modules of a piece of production furniture having an in-use configuration and a different shipping configuration is described below and illustrated in FIGS. 16A and 16B.

In some embodiments, each stackable module is composed of a frame and a plurality of discrete module-connecting members secured to the frame and located to confront like module-connecting members of another stackable module when the two modules are properly stacked and aligned with one another. Typically, though not necessarily, each stackable module has multiple module-connecting members on each of its upper and lower ends for being connected to a stackable module below and/or above depending on how that module is deployed. In some instantiations, such as many of the instantiations illustrated in the accompanying drawings, at least some of the discrete module-connecting members are located at corners of the stackable-module frame and serve the additional function of maintaining, or assisting in maintaining, the shape (e.g., squareness) of the module and keeping, or helping to keep, the module from racking in a horizontal plane.

Depending on the shape, size, configuration, and/or frame composition of the stackable modules and/or on which stackable modules are designed and configured to be stacked on which other modules, a plurality of differing configurations of module-connecting members may be used. For example, in some embodiments, an upper module designed to be stacked on another module has a depth that is less than the depth of a lower module onto which it is designed to be stacked such that having only four corner-type module-connecting members on the lower module is not suitable. In this case, the lower module may include intermediate module-connecting members located to align with corner-type connectors on the less deep upper module. As another example, the thicknesses of frame members forming a corner may vary from one member to the other on one stackable module and/or between corner-forming members of one stackable module relative to another. When the outer peripheral dimensions of such modules are the same, the differing thicknesses require differing module-connecting members to keep the pin receivers in alignment with one another. As yet another example, a particular stackable module may have such a small depth that it is more effective to substitute a single dual-pin-receiver module-connecting member that spans from front to back for two individual corner module-connecting members. Examples of differing configurations of module-connecting members are illustrated in the accompanying drawings and described below.

In some instantiations, each module-connecting member has a pin receiver designed and configured to conformally and snugly receive a connector pin, and the pin receiver in each module-connecting member is located so that when the modules are properly stacked, the pin receivers of the confronting module-connecting members are in registration with one another. When a user has properly stacked a pair of modules so that the pin receivers of the confronting pairs of module-connecting members are in registration with one another, a worker simply installs a connector pin so that it engages both receivers. The worker may then install a like connector pin into the aligned receivers of each of the remaining confronting pairs of module-connecting members. As used herein and in the appended claims, the term "pin" is used in its functional sense of a device designed and configured to joint two things together and is not intended to connote any particular configuration or shape. Thus, for example, a pin of the present disclosure and claims can have any transverse cross-sectional shape, such as circular, rectangular, hexagonal, etc., and may include any of a variety of parts, such as a head or other stop structure, a frusto-conical alignment feature, or a retainer mechanism for preventing the pin from being unintentionally withdrawn from its engaged position, among others, and any combination thereof.

In pin-connected embodiments, once the user has installed all of the connector pins, due to the snugness of fit of the connector pins with the pin receivers, even if the connector pins are not secured by any pin retainers, the upper stackable module will be stable relative to the lower stackable module, generally except that the upper module could be separated from the lower module by lifting the upper module in a direction parallel to the longitudinal axes of the connector pins. To further increase the stability of stacked modules and prevent such separability, each connector pin may be constrained from allowing such separation by providing one or more connector-pin retainers. In some embodiments, each connector pin is secured in place using common rack screws, acting as pin retainers, at the corresponding module-connecting members that collectively act as a connector-pin retainer and firmly secure the stackable modules together. In other embodiments, another type of connector-pin retainer can be provided. Examples of other types of connector-pin retainers include other retainers provided on or via the module-connecting members, such as wing screws and other types of thumb screws, among others, and retainers provided on the connector pins themselves, such as spring-loaded pins, quick-release pins, pushbutton pins, spring-loaded end stops, and cotter pins, among others.

In some embodiments, the stackable modules may be of any suitable size, have any suitable stackable configuration, and include stackable frames that may be composed of members of any suitable shape. In some instantiations, stackable modules of the present disclosure may all be of the same size and/or configuration, and in other instantiations the stackable modules may be of differing sizes and/or configurations. As seen in examples illustrated in the accompanying drawings, in some instantiations stackable modules may be sized and configured according to their intended use. For example, some stackable modules may be designed to be large base modules for use as bases for various types of consoles or workstations, whereas other stackable frames may be designed especially for supporting video monitors of one or more particular sizes, while yet other stackable modules are design for creating only equipment racks or for supporting electronic production equipment between a base module and a monitor-support module, among many others. In some embodiments wherein it is desired that the assembled production furniture be mobile, a dolly module or other type of mobile base module may be provided beneath a stack of other stackable modules. In embodiments having stackable modules of differing sizes, the module-connecting members can be strategically located and/or purposefully configured to accommodate the differing sizes. Examples of this are illustrated in the accompanying drawings and described below.

Embodiments of modular production furniture of the present disclosure are designed to meet demands of production on site in terms of form, fit, and function, while still accommodating a cost efficient and practical solution for ground and/or air transportation. As noted above, an important feature implemented in some instantiations is that an entire system of the modular furniture can be assembled on site with no conventional fasteners whatsoever (such as when the pins have their own retainer mechanisms), while in other instantiations such assembly can be effected with only a single type of fastener, such as a rack screw. Rack screws are ubiquitous in the production industry, wherein workers use them for installing most every piece of equipment designed for the industry into equipment racks or other supports. Engineers on location will almost always have rack screws in their pockets, since they are so common to the workplace. By using connector pins and pin receiver type connections for structural integrity secured by pin-based retainer mechanisms or simple rack screws, a modular production furniture system of the present disclosure is designed to be assembled quickly on location anywhere in the world.

An important aspect of production furniture of the present disclosure is its modularity. An entire system of stackable modules may be designed to categorize the equipment into a modular format to accommodate the particular needs of each production. There is essentially no limit to the configurations a stackable-module system can offer customers, allowing full flexibility during the planning stage of a production and complete onsite reconfigurability when the director or producers want to make changes. No other system of which the present inventors are aware has approached production in a modular format. This approach saves customers in shipping costs, in weight, and especially in setup and breakdown time. This approach also allows a customer complete flexibility onsite to make changes to the configurations based on production needs.

A stackable-module system of the present disclosure used in a flight pack manner competes with a mobile production unit on site; it can have the same form, function, and production value. The use of a stackable-module system of the present disclosure goes beyond a method of improving the use of flight packs in the field; it innovates the whole approach to entertainment production worldwide. Such systems can be used to implement modular configurations for mobile production units. "Flight packs" are cases designed to be air-shipped to location. "Mobile production units," such as production trucks and trailers, are essentially large cases on wheels designed to be driven or trailered to location for use. As previously stated, mobile production units have a committed format and are difficult to change or modify. Using a stackable-module system of the present disclosure, a mobile production unit can provide production with the same flexibility that such a stackable-module system provides for flight packs.

As is well known in the production industry, the typical production of the layout of a mobile production unit for golf is different from the layout needed for basketball. For example, for a golf tournament, 20 to 30 cameras and 20 to 30 instant-replay systems are typically deployed, whereas for a basketball game, 6 to 10 cameras and 4 to 8 instant-replay systems are typically deployed. Using a stackable-module system of the present disclosure, production furniture within a mobile production unit can be reconfigured to accommodate differing uses, such as from an onsite golf production unit to an onsite basketball production unit, and vice versa, among many other reconfigurations. In many popular sports, championship series, such as baseball's World Series, happen in different distant locations where transporting a particular mobile production unit is not feasible in the short amount of time between games. Often, the layout of the mobile production unit varies based on availability, so that the production team must accommodate an entirely new setup when switching venues. With a stackable-module system of the present disclosure, duplicate production environments can be configured for each venue. In addition, providing mobile production units for U.S.-based productions is especially problematic for international events and events in remote states, such as Hawaii.

In larger productions like World Cup soccer tournaments, World Cup ski tournaments, U.S. Open tennis tournaments, U.S. Open golf tournaments, and the Olympics, conventional practice is to create a central production compound to service peak demands. This approach is often implemented using multiple mobile production units. However, using conventional mobile production units is inefficient, since they are designed to be self-contained. Instead of creating one large compound, multiple smaller mobile production units must be linked together as best as possible in attempt to emulate a true central production compound. Unfortunately, the rigidity of the layouts of conventional mobile production units typically results in undesirable compromises. For example, say each conventional mobile production unit carries a 256-squared router (256 inputs and 256 outputs) to handle production signals, but U.S. Open golf tournaments requires a 1500-squared router for its production. With multiple conventional mobile production units linked together, production must allocate live images to the 256 routers in the differing mobile production units, dividing up the production into five or six different locations. Often images must travel from one mobile production unit to another mobile production unit and then to a third mobile production unit before playback.

In contrast, using a stackable-module system of the present disclosure allows central production compounds for large peak demands to be built efficiently. To illustrate, in the context of the present U.S. Open golf tournament example, using a stackable-module system of the present disclosure, the interior, or portion thereof, of a single mobile production unit can configured or reconfigured to support the 1500-squared router to provide a single location with a single path to playback. This makes the setup much more desirable to production. In the past, without a stackable-module system of the present disclosure, this approach would be too costly and too complex to implement. The highly flexible and adaptable (re)configurability of a stackable-module system of the present disclosure is also suited to other remote, or non-studio, venues, such a venues for awards ceremonies (e.g., Oscar Awards, Emmy Awards, Grammy Awards, etc.), inaugurations (e.g., presidential, gubernatorial, etc.), parades (e.g., Macy's Thanksgiving Day parade, Rose Bowl parade, Mummer's parade, etc.), and political debates, among many others.

In addition to providing immense flexibility in configuring and reconfiguring temporary production facilities and mobile production units, outfitting a mobile production unit with electronic production equipment using a stackable-module system of the present disclosure can provide other benefits, including reduced manufacturing costs, relative simplicity of construction, and relatively lightweight outfitted units. Manufacturing costs can be reduced by a number of factors. First, a stackable module system composed of a relatively small set of stackable modules has economies in standardization, and the simplicity with which the modules are connected together create tremendous savings in installation. Simple stacking and connecting together of prefabricated stackable modules of the present disclosure is sharply contrasted with the custom building of electronic production equipment racks, console supports, etc. of conventional mobile production unit fabrication. Second, stackable modules of the present disclosure can be fabricated to provide highly open support structures that have excellent airflow characteristics for keeping electronic production equipment cool. This openness is sharply contrasted with typically closed panel type construction of conventional production furniture. Benefits of this openness are ease of equipment maintenance, reconfiguration, and replacement and reduction of complexity and cost of the cooling and ventilation system needed for any particular production setup. Such benefits can especially be realized in non-mobile temporary onsite installations, such as open rooms, warehouses, and other facilities that are not purpose-built for the equipment. It is also noted that support structures made using a stackable-module system of the present disclosure have vast expanses of equipment space, but in use relatively little equipment is installed, leaving a large portion of these expanses open for air circulation.

Regarding weight efficiencies, lightweight traveling mobile production units can save on fuel costs. Relatedly, if a mobile production unit is filled with a stackable-module system, it can be quickly tailored for the needs of the production, allowing the mobile production unit to be small and lightweight for small shows (e.g., college basketball) and saving traveling weight. The same mobile production unit can then be fully outfitted (heavier) for a big shows (e.g., NCAA Final Four) when needed. Also, a large stackable-module system can be setup in a full 53-foot-long mobile unit, or a small stackable-module system could be fit into a 16-foot-long cargo trailer (with AC unit installed). Clearly, a stackable-module system of the present disclosure provide tremendous flexibilities and value.

In typical conventional mobile-unit manufacturing and as mentioned above, electronic production furniture, such as equipment racks, console supports, and workstations, etc., are custom made and have a panelized construction that generally creates relatively closed support structures that may be considered cabinet-like. This type of construction generally results in compartmentalization as between equipment spaces (e.g., one rack/cabinet versus another rack/cabinet, console base cabinet, etc.), as well as between equipment spaces and human spaces. This compartmentalization can lead to hot spots within individual equipment cabinets. While hot spots, and equipment heat loads in general, can be handled by providing ventilation fans and/or directed cooling from a heating, ventilation, and air-conditioning (HVAC) system, each of these solutions adds to the complexity and cost of the mobile production unit. In addition, with compartmentalization as between equipment spaces and human spaces, the production crew may be kept cool with HVAC subsystems dedicated to the human spaces, and, as such, the production crew may not recognize when equipment overheating might be occurring, since they feel cool from their dedicated cooling. In stark contrast, a highly open equipment support system, such as can be created using a stackable-module system of the present disclosure, within a mobile production unit can be cooled using an HVAC system that cools the entire volume containing the electronic production equipment and the human spaces. In this manner, the production crew has an immediate sense of the temperature of the electronic production equipment—if the crew is cool, the equipment is cool, since they occupy the same volume and the support structures are widely open within that volume. Having to provide HVAC to only a single space can significantly reduce the complexity and costs of an HVAC system, for a mobile production unit.

Other benefits of using a stackable-module system of the present disclosure over fixed installations for a mobile production unit include, but are not limited to:

Configurability—the floorplan of mobile production unit can be readily changes for the production needs, for example, from a sports production, to live awards show, music production (festival), etc.

Scalability—the extent the stackable-module system deployed in a mobile production unit can be readily scaled up or down to match the size of the production, for example, from small shows to big shows.

Long range transferability—if the production gear needs to be shipped from mainland U.S. to Hawaii for example, it can be easily removed and travel on air-cargo without the shell.

Short range transferability—for a venue having limited truck space but excess interior floor space, the production gear can come off the mobile production Unit and be setup indoors.

Exemplary Embodiments

With the foregoing descriptions in mind, following are detailed examples of various aspects of the present inventions ranging from an exemplary connection system and exemplary stackable modules to exemplary support structures and installations made using stackable modules and connection systems of the present disclosure. Also described below are examples of mobile production units built with highly open frame-only electronic production equipment support structures that allow for simple reconfigurability and relatively inexpensive HVAC systems.

Referring now to the drawings, FIG. 1 illustrates an exemplary piece 100 of modular production furniture built using nine stackable modules made in accordance with aspects of the present invention, namely, a dolly module 104, two base modules 108(1) and 108(2), a cantilevered console module 112, two high-rise equipment modules 116(1) and 116(2), a pair of small-monitor modules 120(1) and 120(2), and a large-monitor module 124. As described below in conjunction with FIGS. 2-7 that illustrate, respectively, each type of various stackable modules 104, 108(1), 108(2), 112, 116(1), 116(2), 120(1), 120(2), and 124 of piece 100 of modular production furniture, these modules are connected with one another using four differing types of module-connecting members. Those skilled in the art will readily appreciate that piece 100 of modular production furniture, when fully deployed for use, will include several pieces of electronic equipment, such as, but not limited to, a control console supported by console module 112, a pair of small video monitors supported, respectively, by small-monitor modules 120(1) and 120(2), and a large video monitor supported by large-monitor module 124, not to mention other pieces that may be contained in either or both of base modules 108(1) and 108(2) and/or either or both of high-rise equipment modules 116(1) and 116(2).

As those skilled in the art will readily appreciate, the number of possible configurations of the stackable modules of piece 100 of modular production furniture is large, and this considers only the nine modules 104, 108(1), 108(2), 112, 116(1), 116(2), 120(1), 120(2), and 124 of the six differing types illustrated in FIG. 1, namely, a two-module-wide dolly type, a base type, a two-module-wide front-cantilever console type, a high-rise equipment type, a small-monitor type, and a large-monitor type. As described below, these and/or other module types can be stacked and arranged in many differing way to create many differing pieces of modular production furniture. Examples of other module types include, but are not limited to, wider and narrower dolly types, wider and narrower tabletop types, front and/or rear cantilever or no cantilever tabletop types, higher- and lower-rise equipment types, larger and smaller video monitor types, and riser type, among others.

All confronting stacked pairs of modules 104, 108(1), 108(2), 112, 116(1), 116(2), 120(1), 120(2), and 124 are connected together via module-connecting members, such as module-connecting members 140, 144, and 148 (only one of each labeled for convenience; others are readily discernable), affixed to corresponding respective ones of the modules and corresponding connector pins, such as connector pins 152 and 156 (only one of each labeled for convenience; others are readily discernable). In this example and as described below in more detail, module-connecting members 140, 144, and 148 are of differing types designed and configured for three differing applications. Briefly, however: module-connecting member 140 is designed and configured to be located in a reentrant corner formed between two frame members or two perpendicular parts of a single member of the corresponding stackable module that have the same width, such as reentrant corner 160 (FIG. 3) between frame members 312(1) and 312(2) of stackable base module 108 (1); module-connecting member 144 is designed and configured to be located in a reentrant corner of a joint between two frame members of the corresponding stackable module that have differing widths, such as reentrant corner 164 (FIG. 5) between frame members 116(2)A and 116(2)B of stackable high-rise equipment module 116(2); and module-connecting member 148 is designed and configured to be located along a frame member between two reentrant corners, such as shown at location 168 (FIG. 4) on console module 112. Connector pins 152 and 156 are also of differing types. In this example, connector pin 152 is a standalone connector pin having a length selected for connecting together two confronting module-connecting members on two modules stacked with one another, such as confronting module-connecting members 144 and 148 on stackable high-rise equipment module 116(2) and console module 112, respectively, while connector pin 156 is part of a caster 172 and has a length for connecting together to confronting module-connecting members on two modules stacked with one another, here dolly module 104 and base module 108(2). Examples of other module-connecting members and connector pins are described and/or listed below.

Figure 2:
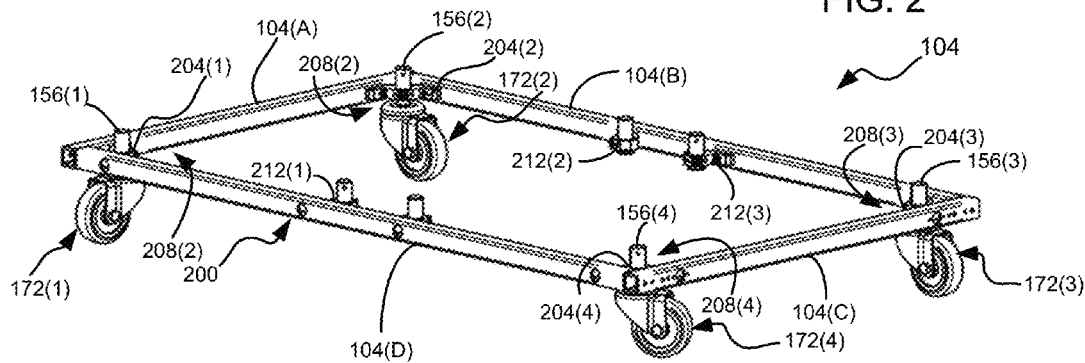
FIG. 2 is an enlarged isometric view of the dolly module of the piece of modular production furniture of FIG. 1.

FIG. 2 shows dolly module 104 of FIG. 1. As seen in FIG. 2, in this example dolly module 104 includes four rectangular tubular frame members 104(A) to 104(D) secured to one another to form a rigid rectangular frame 200. Dolly module 104 also includes four symmetrical corner-type module-connecting members 204(1) to 204(4) located at the four reentrant corners 208(1) to 208(4) of frame 200, along with four intermediate-type module-connecting members 212(1) to 212(4) located to align with and be connected to corresponding ones of symmetrical corner-type module-connecting members 320(1) to 320(4) on the lower ends of base modules 108(1) and 108(2). In this example, dolly module includes four casters 172(1) to 172(4) with integral connector pins 156(1) to 156(4) that not only secure the casters to the dolly module but are also used to connect the base modules to dolly module. As seen in FIG. 1, frame 200 in this example is sized to be the size of two base modules 108(1) and 108(2) abutted side to side. Tubular frame members 204(1) to 204(4) may be made of any suitable material(s), such as metal, polymer, composite, etc. Rectangular tubular frame members 204(1) to 204(4) may be replaced by any other type(s) of members, such as solid members, angles, I-shaped members, etc.

Figure 3:
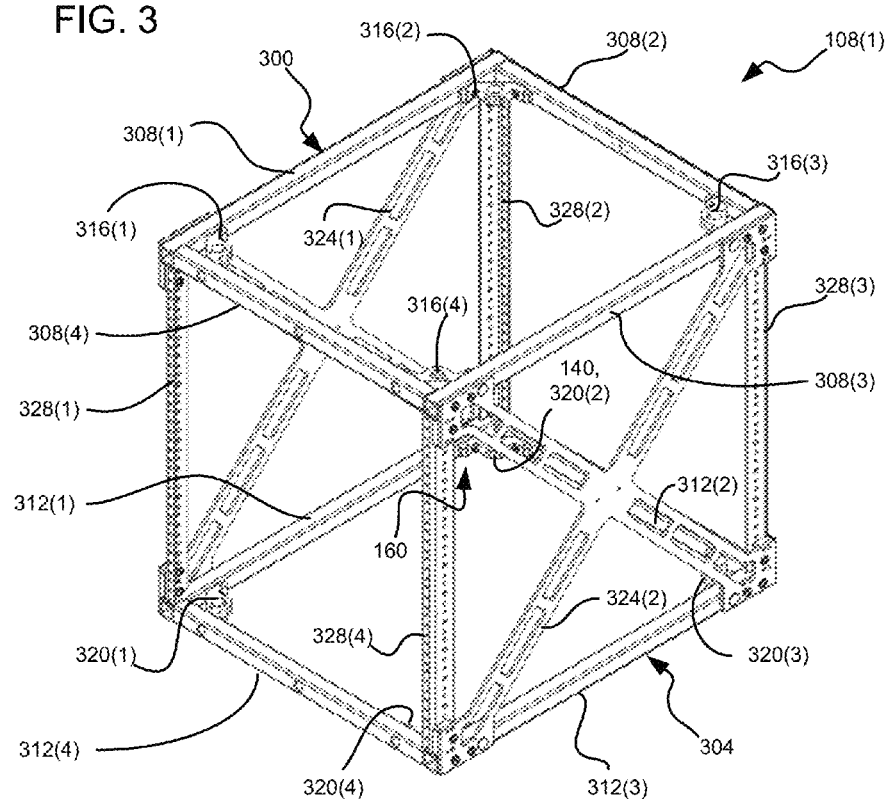
FIG. 3 is an enlarged isometric view of one of the base modules of the piece of modular production furniture of FIG. 1.

FIG. 3 illustrates base module 108(1) of FIG. 1 (base module 108(2) is identical). As seen in FIG. 3, in this embodiment, base module 108(1) may be considered to have upper and lower rectangular frames 300 and 304 each comprising four rectangular tubular members 308(1) to 308(4) and 312(1) to 312(4), respectively. Each reentrant corner of upper and lower frames 300 and 304 has a corresponding symmetrical module-connecting member 316(1) to 316(4) and 320(1) to 320(4) secured to the corresponding pair of rectangular tubular frame members 308(1) to 308(4) and 312(1) to 312(4). Upper and lower frames 300 and 304 are connected to one another via a pair of X-brace members 324(1) and 324(2) on the sides of base module 108(1). In this example, X-brace members 324(1) and 324(2) are slotted to reduce their weight and to provide more open space for airflow through base modules 108(1). Base module 108(1) also includes four vertical edge members 328(1) to 328(4), each of which in this example is a structure angle member having regularly spaced openings in each of its legs to allow electrical equipment to be secured to base module 108(1). In other embodiments, the various structural members of base module 108(1), such as rectangular tubular members 308(1) to 308(4) and 312(1) to 312(4) and X-brace members 324(1) and 324(2), may be different from the members shown in FIGS. 1 and 3 and described herein. In the embodiment shown, Each of rectangular tubular members 308(1) to 308(4) and 312(1) to 312(4) and X-brace members 324(1) and 324(2) are made of metal. However, in other embodiments these members may be made of any other suitable materials, such as a polymer or composite, among others.

Figure 4:
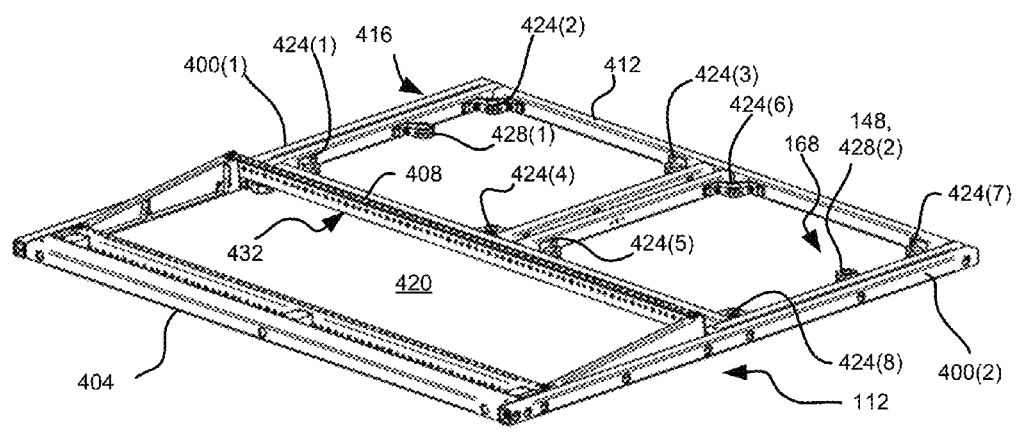
FIG. 4 is an enlarged isometric view of the console module of the piece of modular production furniture of FIG. 1.

FIG. 4 shows console module 112 of FIG. 1. As seen in FIG. 4, in this example console module 112 is sized to be supported by two base modules, here base modules 108(1) and 108(2), abutting one another side by side and includes rectangular tubular end members 400(1) and 400(2) and rectangular tubular front, intermediate, and rear members 404, 408, and 412, respectively that together define a base-support region 416 and a cantilevered console-receiving region 420 sized and configured to receive a suitable control console. In this example, base support region 416 includes a total of ten module-connecting members, eight symmetrical corner-type module-connecting members 424(1) to 424(8) for connecting console module 112 to the upper symmetrical corner-type module connection members 316(1) to 316(4) (FIG. 3) of each base module 108(1) and 108(2) (FIG. 1) and two intermediate-type module-connecting members 428(1) and 428(2) for connecting to high-rise equipment modules 116(1) and 116(2) (FIG. 1). In the embodiment shown, each of rectangular tubular members 400(1), 400(2), 404, 408, and 412 is made of metal, though in other embodiments these members may be made of one or more of any suitable material, such as a polymer or composite, among others. In addition, it is noted that members 400(1), 400(2), 404, 408, and 412 need not be tubular but rather can be of any other suitable type, such as solid members, angles, I-shaped members, etc. In the embodiment shown, console module 112 also includes a console-support frame 432 of sorts with an opening for accommodating a rim-supported type console. In other embodiments, console-support frame 432, if provided, may be a full tabletop, perhaps provided with one or more smaller openings, for example, for running cables. If a tabletop is provided, it may be made of any suitable material, such a solid surfacing, laminated material, wood, composite, etc.

Figure 5:
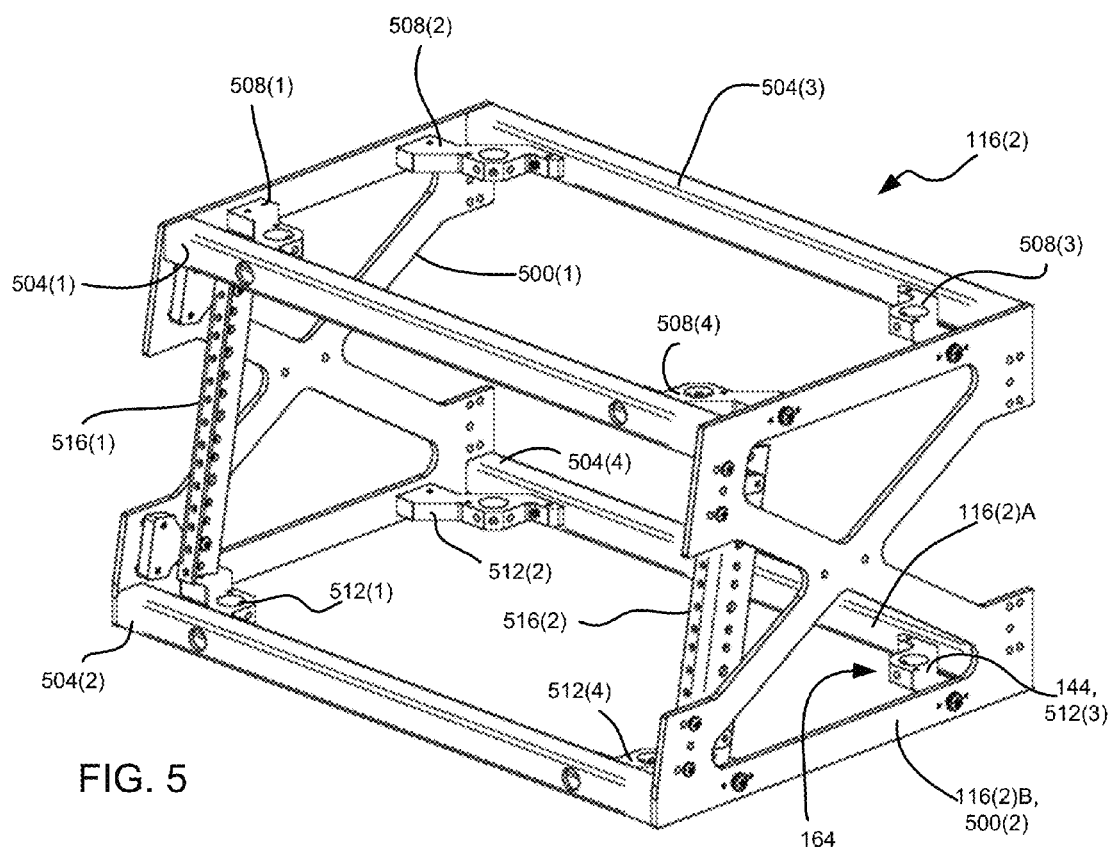
FIG. 5 is an enlarged isometric view of one of the high-rise equipment modules of the piece of modular production furniture of FIG. 1.

FIG. 5 illustrates high-rise equipment module 116(1) of FIG. 1 (high-rise equipment module 116(2) is identical). As seen in FIG. 5, in this embodiment, high-rise equipment module 116(1) may be considered to have a pair of hourglass-shaped end members 500(1) and 500(2) joined together by four rectangular tubular members 504(1) to 504(4), two each at the front and rear of the high-rise equipment module. Each reentrant corner formed by abutting ones of hourglass-shaped end members 500(1) and 500(2) and rectangular tubular members 504(1) to 504(2) has a corresponding asymmetrical corner-type module-connecting member 508(1) to 508(4) (upper) and 512(1) to 512(3) (lower). In this example, all but asymmetrical corner-type module-connecting member 512(1) is used to join high-rise equipment module 316(1) to console module 112 (FIG. 1). In this connection, it is noted that in other embodiments, console module 112 may include an intermediate-type module-connecting member (not shown) in registration with asymmetrical corner-type module-connecting member 412(3) when high-rise equipment module 116(1) is properly stacked on the console module as shown in FIG. 1. In this example, high-rise equipment module 116(1) also includes a pair of equipment-mounting members 516(1) and 516(2) designed and configured for mounting one or more rack-mount-type electronic components (not shown), for example, using standard rack-mounting screws (not shown). In the embodiment shown, each equipment mounting member 516(1) and 516(2) is an angle member. In other embodiments, the various structural members of high-rise equipment module 116(1), such as hourglass-shaped end members 500(1) and 500(2) and rectangular tubular members 504(1) to 504(4), may be different from the members shown in FIGS. 1 and 5 and described herein. In the embodiment shown, each of hourglass-shaped end members 500(1) and 500(2) and rectangular tubular members 504(1) to 504(4) are made of metal. However, in other embodiments these members may be made of any other suitable materials, such as a polymer or composite, among others.

FIG. 6 illustrates small-monitor module 120(1) of FIG. 1 (small-monitor module 120(2) is identical). As seen in FIG. 6, in this embodiment, small-monitor module 120(1) may be considered to have a pair of lower and upper sub-frames 600(1) and 600(2) and a pair of hourglass-shaped end members 604(1) and 604(2) joining together the upper and lower sub-frames. In this example, each lower and upper sub-frame 600(1), 600(2) comprises three rectangular tubular members 608(1) to 608(3) and 612(1) to 612(3), respectively. In the example shown, small-monitor module 120(1) includes two symmetrical-corner-type module-connecting members 616(1) and 616(2) on lower sub-frame 600(1) and two symmetrical-corner-type module-connecting members 624(1) and 624(2) on upper sub-frame 600(2). In this example, small-monitor module 120(1) also includes a pair of monitor support members 632(1) and 632(2) designed and configured for mounting a small video monitor to the small-monitor module, for example, using standard rack-mounting screws (not shown). In the embodiment shown, each equipment mounting member 632(1) and 632(2) is an angle member and may be mounted to hour-glass-shaped end members 604(1) and 604(2) via arcuate slots 636(1) and 636(2) (slot 636(2) is not seen, but is in the same relative location as arcuate slot 636(1)) so that the small video monitor can be pivoted in a vertical plane to accommodate optimal viewing of the small video monitor by a production worker. In other embodiments, the various structural members of small-monitor module 120(1), such as hour-glass-shaped end members 604(1) and 604(2) and rectangular tubular members 608(1) to 608(4) and 612(1) to 612(4), may be different from the members shown in FIGS. 1 and 6 and described herein. In the embodiment shown, each of hour-glass-shaped end members 604(1) and 604(2) and rectangular tubular members 608(1) to 608(4) and 612(1) to 612(4) are made of metal. However, in other embodiments these members may be made of any other suitable materials, such as a polymer or composite, among others.

FIG. 7 illustrates large-monitor module 124 of FIG. 1. As seen in FIG. 7, in this embodiment, large-monitor module 124 may be considered to have a pair of lower and upper sub-frames 700(1) and 700(2) and a pair of hourglass-shaped end members 704(1) and 704(2) joining together the upper and lower sub-frames. In this example, each lower and upper sub-frame 700(1), 700(2) comprises three rectangular tubular members 708(1) to 708(3) and 712(1) to 712(3), respectively. In the example shown, large-monitor module 124 includes two symmetrical corner-type module-connecting members 716(1) and 716(2) on lower sub-frame 700(1) at the rear reentrant corners and two symmetrical corner-type module-connecting members 724(1) and 724(2) on upper sub-frame 700(2) at the rear reentrant corners. In this example, large-monitor module 124 also includes a monitor support frame 732 designed and configured for mounting a large video monitor (such as large video monitor 136 of FIG. 1) to the large-monitor module. In the embodiment shown, monitor support frame 732 includes holes 736(1) to 736(4) for receiving suitable fasteners for securing the large monitor to the monitor support frame via conventional threaded openings on the monitor. Monitor support frame are mounted to hour-glass-shaped end members 704(1) and 704(2) via arcuate slots 740(1) and 740(2) so that the large video monitor can be pivoted in a vertical plane to accommodate optimal viewing of the large video monitor by a production worker. In other embodiments, the various structural members of large-monitor module 124, such as hour-glass-shaped end members 704(1) and 704(2) and rectangular tubular members 708(1) to 708(4) and 712(1) to 712(4), may be different from the members shown in FIGS. 1 and 7 and described herein. In the embodiment shown, each of hour-glass-shaped end members 704(1) and 704(2) and rectangular tubular members 708(1) to 708(4) and 712(1) to 712(4) are made of metal. However, in other embodiments these members may be made of any other suitable materials, such as a polymer or composite, among others.

FIGS. 8A to 11 illustrate several exemplary module-connecting members 800, 900, 1008, and 1100 made in accordance with aspects of the present invention. As should be readily understood, these examples are merely illustrative and should be considered as such. Those skilled in the art will be able to make any one or more of a variety of modifications that can render the modified module-connecting member different in visual character relative to the examples shown but that nonetheless perform the same function. Examples of modifications that can be made include, but are not limited to: overall shape; overall dimensions; surface contours; locations, number, and type of features for fastening a module-connecting member to a corresponding stackable frame; locations, number, size, and shape of connector pin receivers; and location, number, and type of features, if any, for securing a connector pin in place relative to the module-connecting member at issue.

Figure 8A:
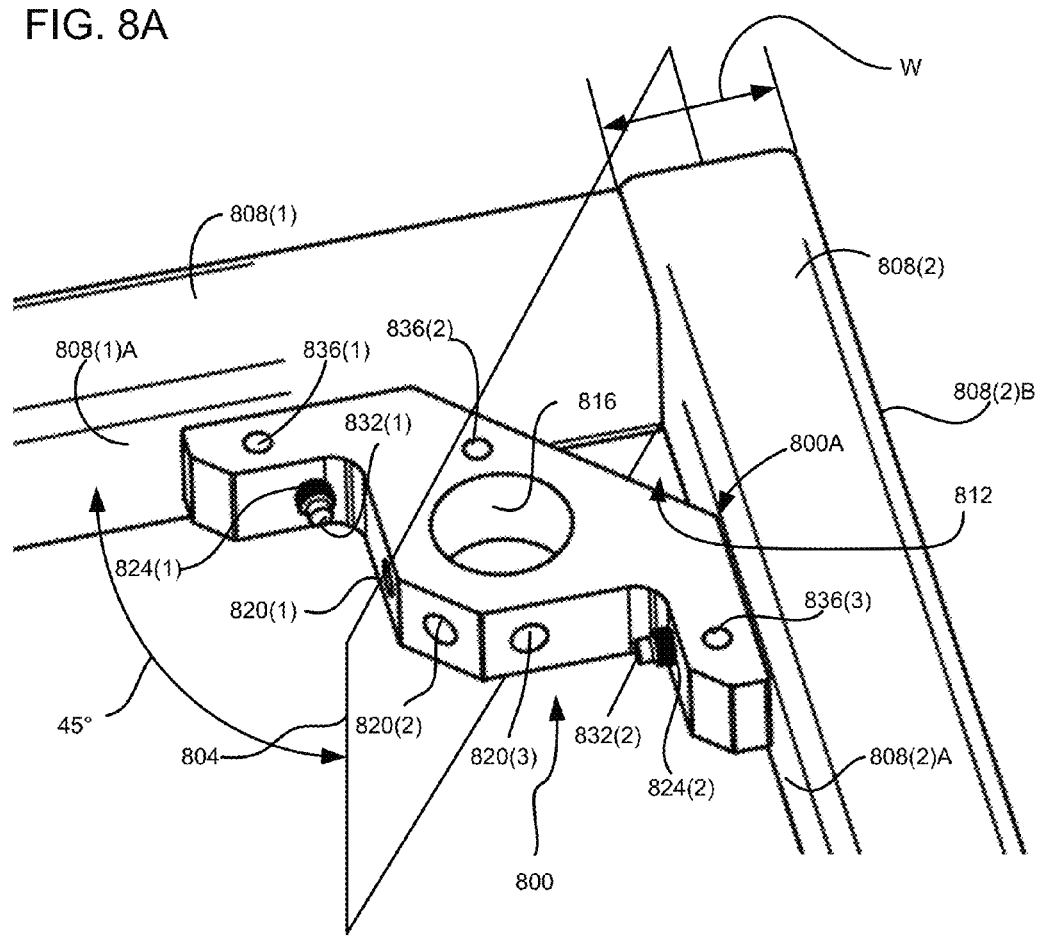
FIG. 8A is an isometric partial view of a stackable module of the present disclosure, showing a symmetrical corner-type module-connecting member located at a reentrant corner formed by a pair of like-sized frame members of the stackable module.

Referring to FIG. 8A, this figure shows exemplary module-connecting member 800 of the symmetrical corner type. Instantiations of module-connecting member 800 may be used for all of symmetrical corner-type module-connecting members 140 noted above relative to FIG. 1. In the example shown in FIG. 8A, module-connecting member 800 is symmetrical about a plane of symmetry 804 oriented 45° relative to the stackable frame members forming the reentrant corner at issue, here frame members 808(1) and 808(2) forming reentrant corner 812. Module-connecting member 800 includes a single connector-pin receiver 816 sized to snugly receive a corresponding connector pin (not shown). In this connection, module-connecting member 800 includes three threaded locking-screw apertures 820(1) to 820(3) each threaded to threadingly receive a screw, such as a conventional equipment rack screw, wing-ended screw, etc., for holding the connector pin (not shown) in place once inserted into connector-pin receiver 816. While three locking-screw apertures 820(1) to 820(3) are provided, it is noted that in some installations only one needs to be used, with the three providing a user a choice of which one to use, for example, based on accessibility, convenience, etc.

Figure 8B:
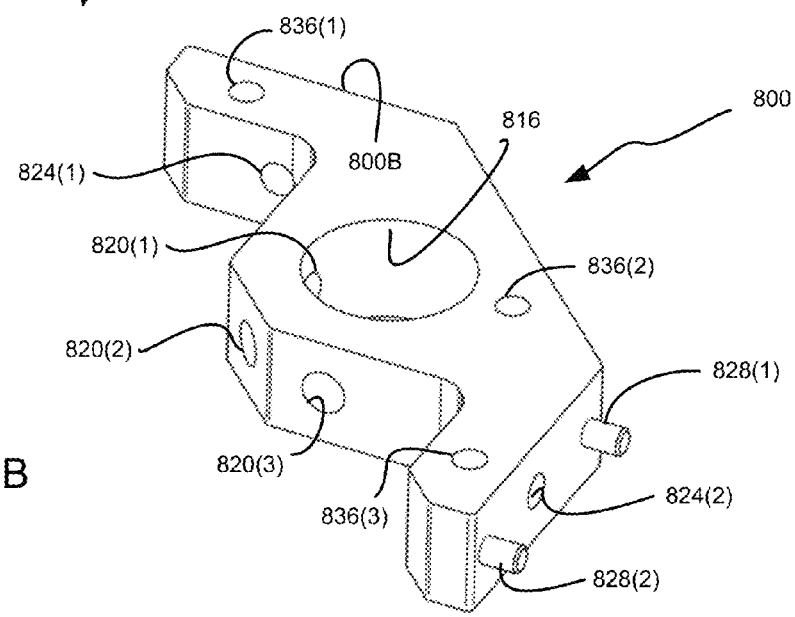
FIG. 8B is an isometric view of the symmetrical corner-type module-connecting member of FIG. 8A showing alignment pins on one end of the module-connecting member.

Also in this example, module-connecting member 800 includes two threaded apertures 824(1) and 824(2) provided for securing the module-connecting member 800 to frame members 808(1) and 808(2). As seen in FIG. 8B, module-connecting member 800 may include one or more alignment features, such as alignment pins 828(1) and 828(2), on each of its faces 800A and 800B that engage one or the other of frame members 808(1) and 808(2) to aid in locating and keeping it in proper alignment with the frame members. Each of these alignment features may engage a corresponding mating feature, such as an aperture, dimple, etc., on the corresponding one of frame members 808(1) and 808(2). Referring again to FIG. 8A, each threaded aperture 824(1), 824(2) is engaged by a corresponding screw 832(1), 832(2) installed through the corresponding frame member 808(1), 808(2). In other embodiments, threaded apertures 824(1) and 824(2) may be provided in different numbers and/or may be replaced by threaded openings that do not extend all the way through module-connecting member 800. In some embodiments, frame members 808(1) and 808(2) may have threaded openings such that apertures 824(1) and 824(2) need not be threaded and screws 828(1) and 828(2) may be installed from the interior of frame 808. In this example, each frame member 808(1), 808(2) is a tubular member, and each screw 828(1), 828(2) clamps the inside wall 808(1)A, 808(2)A of the corresponding frame member between a head (not shown) of that screw and module-connecting member 800. This means that the head of each screw 828(1), 828(2) is located inside the corresponding frame member 808(1), 808(2), and access may be provided by locating an opening in the outside wall (not seen) of each frame member. In other embodiments involving tubular frame members 808(1) and 808(2) or solid member, each screw 828(1) and 828(2) may extend all the way through the frame member such that the head of that screw is external to the frame members.

Also in this example, module-connecting member 800 includes three threaded openings 836(1) to 836(3) provided for securing a horizontal component (not shown), such as a tabletop, shelf, etc., to the module-connecting member and to the stackable module and piece of module furniture of which the module-connecting member is a part. It is noted that the opposite face (here, underside) of module-connecting member 800 may be provided with three threaded openings identical to threaded openings 836(1) to 836(3) so that either face can face upward and have the same functionality. In some embodiments, instead of providing threaded openings in both faces, the threaded openings may be replaced by threaded apertures, i.e., holes that extend all the way through module-connecting member 800. In some embodiments, module-connecting member 800 is made of metal, such as steel or aluminum, though it can be made of any suitable material. In addition, it is noted that other means can be used to secure module-connecting member 800 to frame members 808(1) and 808(2), including mechanical fasteners other than screws, adhesive bonding, welding, integral molding, etc. Fundamentally, there is no limitation on the manner in which module-connecting member 800 can be secured to frame members 808(1) and 808(2).

Figure 9:
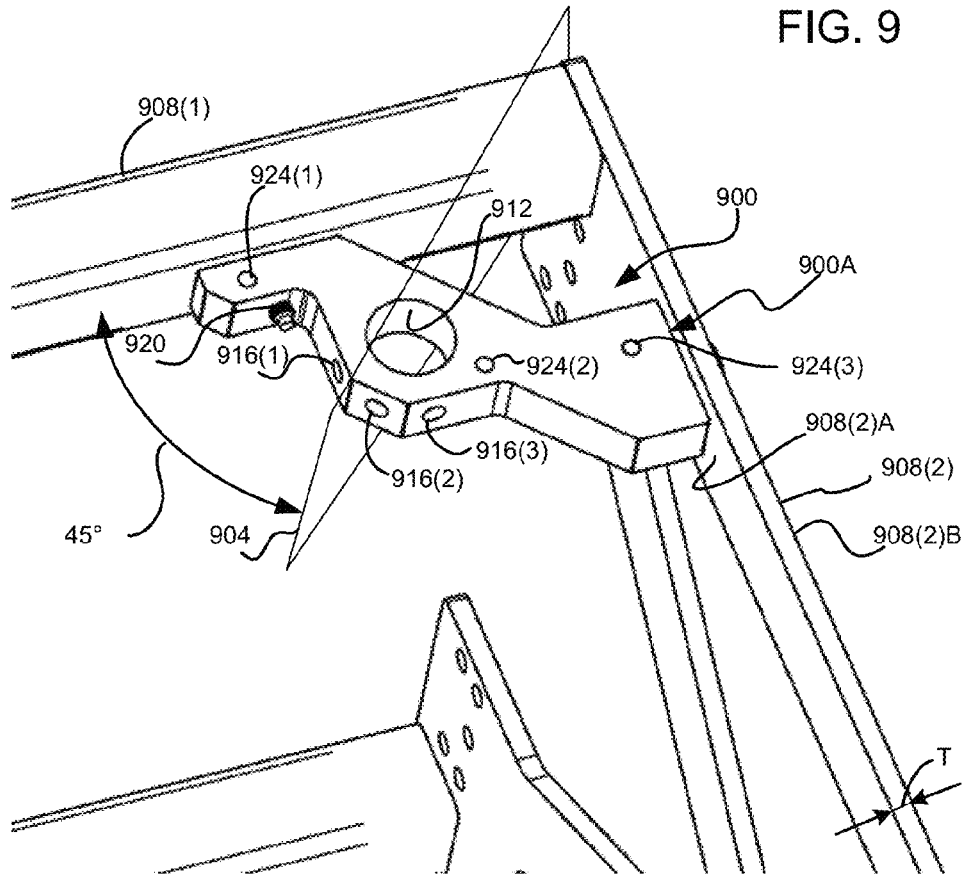
FIG. 9 is an isometric partial view of a stackable module of the present disclosure, showing an asymmetrical corner-type module-connecting member located at reentrant corner formed by a pair of differing-size frame members of the stackable module.

FIG. 9 an exemplary module-connecting member 900 of the asymmetrical corner type. Instantiations of module-connecting member 900 may be used for all of asymmetrical corner-type module connection members 144 noted above relative to FIG. 1. In the example shown in FIG. 9, module-connecting member 900 is asymmetrical about a plane of symmetry 904 that forms a 45° angle with each of frame members 908(1) and 908(2) and that divides connector-pin receiver 912 into equal halves. Module-connecting member 900 is asymmetrical about plane of symmetry 904 due to the position of the inner face 908(2)A of frame member 908(2) within frame 908 and the need for connector-pin receiver 912 to be in registration with a corresponding connector-pin receiver (not shown) on another stackable module (not shown) when properly stacked on frame 908. Visually comparing FIGS. 9 and 8, it is readily seen that frame member 908(2) of FIG. 9 is in a position where its outer face 908(2)B is at the same position as the outer face 808(2)B of frame member 808(2) of FIG. 8. However, the horizontal thickness, T, of frame member 908(2) of FIG. 9 is less than the horizontal width, W, of frame member 808(2) of FIG. 8, requiring the right-hand end 900A (relative to FIG. 9) of module-connecting member 900 of FIG. 9 to be extended relative to the right-hand end 800A (relative to FIG. 8A) of module-connecting member 800 of FIG. 8A to make up the difference between thickness T (FIG. 9) and width W (FIG. 8). All other aspects and features of module-connecting member 900 of FIG. 9, such as connector-pin receiver 912, threaded locking-screw apertures 916(1) to 916(3), threaded aperture 920, threaded openings 924(1) to 924(3), material(s) of construction, dimensions, means for connecting to frame members 908(1) and 908(2) or other frame members, alignment feature(s), etc., may be the same as or similar to the corresponding aspects and features of module-connecting member 800 of FIG. 8.

Figure 10:
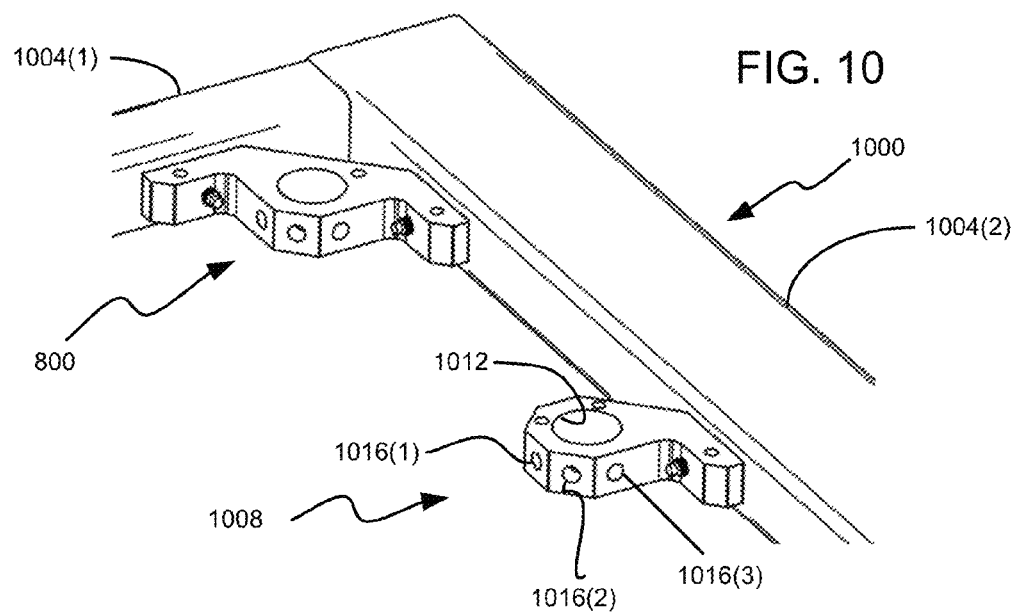
FIG. 10 is an isometric partial view of a stackable module of the present disclosure, showing a symmetrical corner-type module-connecting member located at a reentrant corner of the stackable module and an intermediate-type module-connecting member.

FIG. 10 illustrates a portion of a stackable frame 1000 that includes a pair of frame members 1004(1) and 1004(2), one instance of symmetrical corner-type module-connecting member 800 (see FIG. 8A and corresponding description), and an intermediate module-connecting member 1008. Instantiations of intermediate module-connecting member 1008 may be used for all of intermediate module-connecting members 148 noted above relative to FIG. 1. In the example shown in FIG. 10, intermediate module-connecting member 1008 is essentially symmetrical corner-type module-connecting member 800 modified to eliminate the portion provided to secure it to a second frame member. Consequently, other aspects and features of intermediate module-connecting member 1008 that are present, such as connector-pin receiver 1012, threaded locking-screw apertures 1016(1) to 1016(3), threaded aperture 1020, threaded openings 1020(1) to 1020(3), material(s) of construction, dimensions, means for connecting to frame members 1004(1) and 1004(2) or other frame members, alignment feature(s), etc., may be the same as or similar to the corresponding aspects and features of module-connecting member 800 of FIG. 8. In other embodiments, such as an embodiment corresponding to asymmetric corner-type module-connecting member 900 of FIG. 9, the intermediate module-connecting member may need to be extended to accommodate a frame member, such as frame member 908(2) of FIG. 9, that is set back as described above relative to FIG. 9. Intermediate module-connecting member 1008 can be used in a variety of situations wherein any pair of stacked modules do not have corner-type module-connecting members that align with one another but wherein connection between the two stackable modules is desired, for example, for stability.

Figure 11:
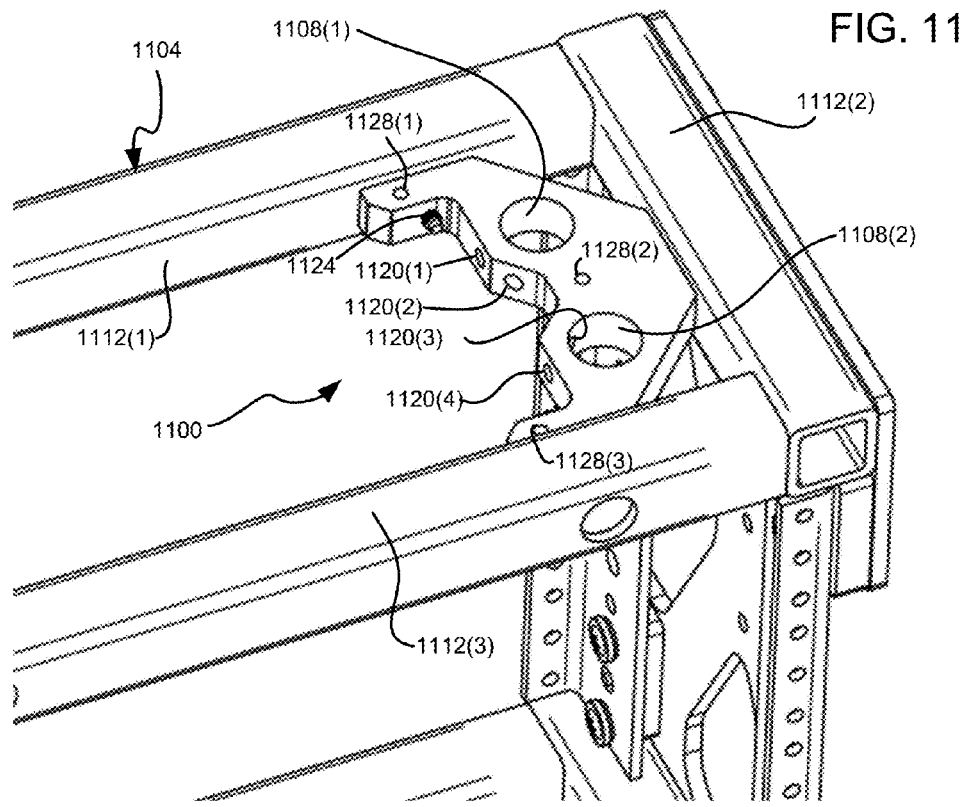
FIG. 11 is an isometric partial view of a stackable module of the present disclosure, showing a double-corner-type module-connecting member.

FIG. 11 illustrates a double-pin-receiver module-connecting member 1100 that is suitable for use, for example, in stackable modules, such as stackable module 1104, wherein corner-type module-connecting members, such as either or both of corner-type module connection members 800 and 900 of FIGS. 8 and 9, respectively, are desired at adjacent corners but insufficient space exists to accommodate two individual corner-type module-connecting members. As can be seen in FIG. 11, double-pin-receiver module-connecting member 1100 includes a pair of pin receivers 1108(1) and 1108(2) and is configured to contact each of frame members 1112(1) to 1112(3) and be secured thereto. Other aspects and features of double-connector-pin module-connecting member 1100 that are present, such as connector-pin receiver 1108(1) and 1108(2), threaded locking-screw aperture 1120 (1) to 1120(4), threaded aperture 1124 (only one seen in FIG. 11), threaded openings 1128(1) to 1128(3), material(s) of construction, dimensions, means for connecting to frame members 1112(1) to 1112(3) or other frame members, alignment feature(s), etc., may be the same as or similar to the corresponding aspects and features of module-connecting member 800 of FIG. 8.

Figure 12:
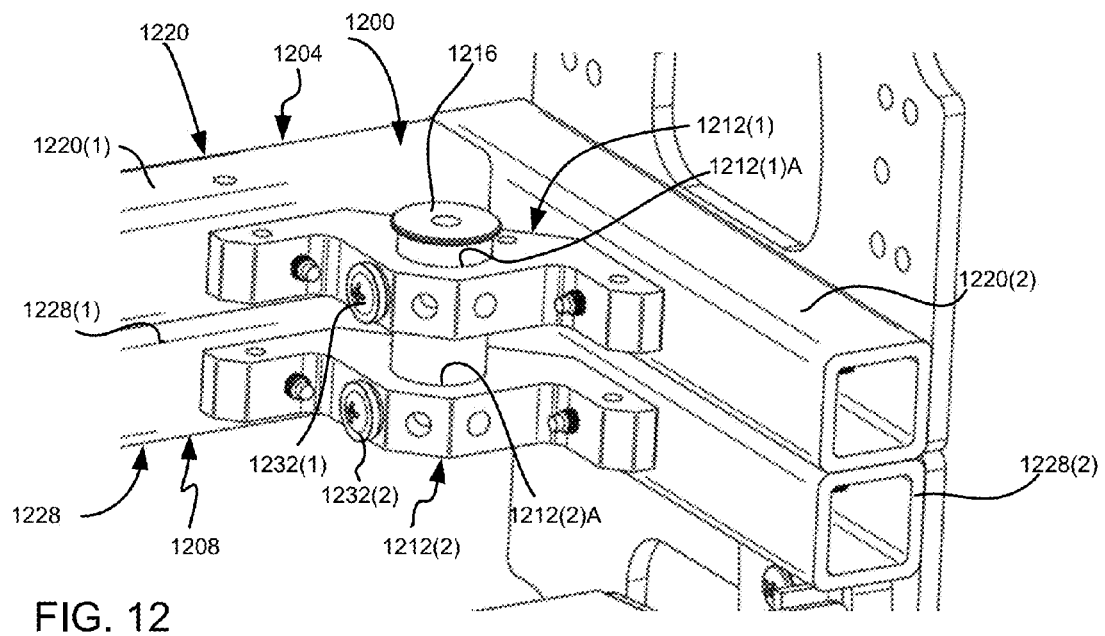
FIG. 12 is an isometric partial view of a pair of stackable modules stacked with one another, showing a pair of symmetrical corner-type module-connecting members and a connector pin secured in the pin receivers of the module-connecting members so as to at least partially secure the stackable modules together.

FIG. 12 illustrates an example of a connection 1200 between two stackable modules 1204 and 1208 properly stacked one on the other. In this example, connection 1200 is formed by two instantiations 1212(1) and 1212(2) of symmetrical corner-type module-connecting member 800 of FIG. 8A and a connector pin 1216 that snugly engages corresponding respective connector-pin receivers 1212(1)A and 1212(2)A. Connection 1200 is representative of the connections within piece 100 of modular production furniture of FIG. 1 that are between confronting pairs of symmetrical corner-type module connection members 140. Referring still to FIG. 12, module-connecting member instantiation 1212(1) is fixedly connected to frame members 1220(1) and 1220(2) of frame 1220 of stackable module 1204 in the manner described above in connection with FIG. 8, and, similarly, module-connecting member instantiation 1212(2) is fixedly connected to frame members 1228(1) and 1228(2) of frame 1228 of stackable module 1208. In the embodiment shown in FIG. 12, connector pin 1216 is fixedly secured within connector-pin receivers 1212(1)A and 1212 (2)A using a pair of "equipment rack" type locking screws 1232(1) and 1232(2).

Figure 13:
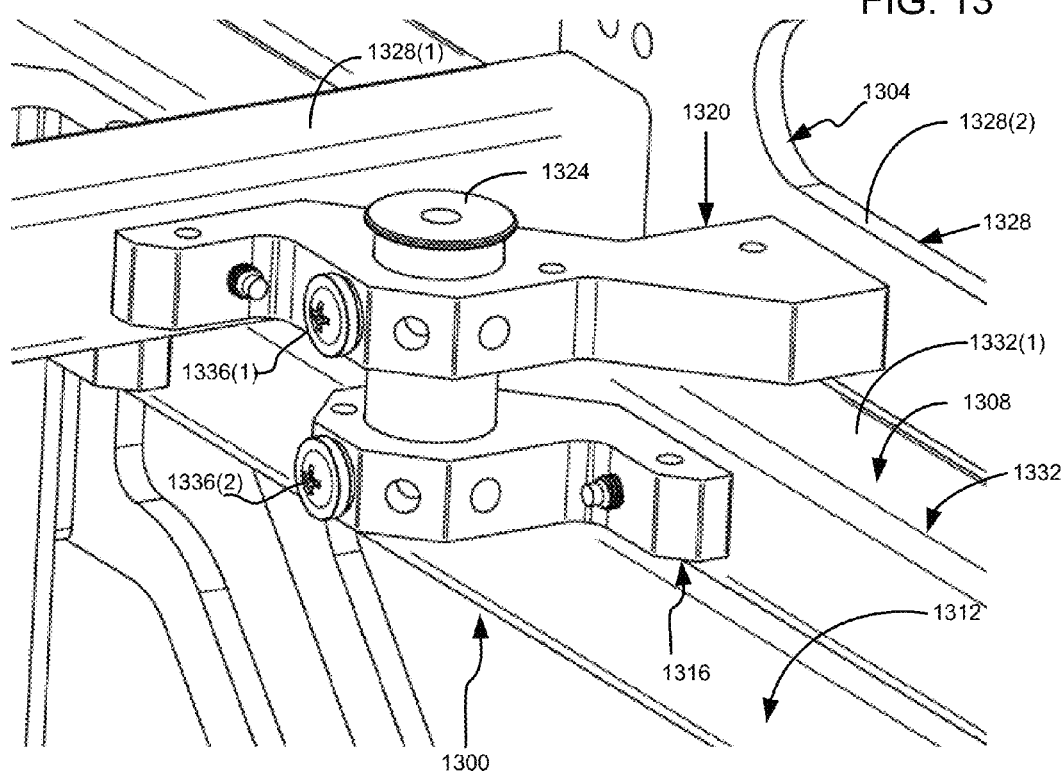
FIG. 13 is an isometric partial view of a pair of stackable modules stacked with one another, showing an intermediate-type module connection member, a symmetrical corner-type module-connecting member, and a connector pin secured in the pin receivers of the module-connecting members so as to at least partially secure the stackable modules together.

FIG. 13 illustrates another example of a connection 1300 between two stackable modules 1304 and 1308 properly stacked one on the other. It is noted that FIG. 13 illustrates a third stackable module 1312 stacked on module 1308, but no connections involving it are shown in FIG. 13. In this example, connection 1300 is formed between an instantiation 1316 of intermediate module-connecting member 1008 of FIG. 10 and an instantiation 1320 of asymmetrical corner-type module-connecting member 900 of FIG. 9. A connector pin 1324 is snugly engaged with each of corresponding respective connector-pin receivers 1316A and 1320A of intermediate module-connecting member and asymmetrical corner-type module-connecting member instantiations 1316 and 1320. Connection 1300 is representative of the connections within piece 100 of modular production furniture of FIG. 1 that are between confronting pairs of symmetrical corner-type module connection members 140. Referring still to FIG. 13, module-connecting member instantiation 1316 is fixedly connected to frame members 1328(1) and 1328(2) of frame 1328 of stackable module 1304 in the manner described above in connection with FIG. 9, and, similarly, module-connecting member instantiation 1320 is fixedly connected to frame member 1332(1) of frame 1332 of stackable module 1308. In the embodiment shown in FIG. 13, connector pin 1324 is fixedly secured within connector-pin receivers 1316A and 1320A using a pair of equipment rack type locking screws 1336(1) and 1336(2).

Figure 14:
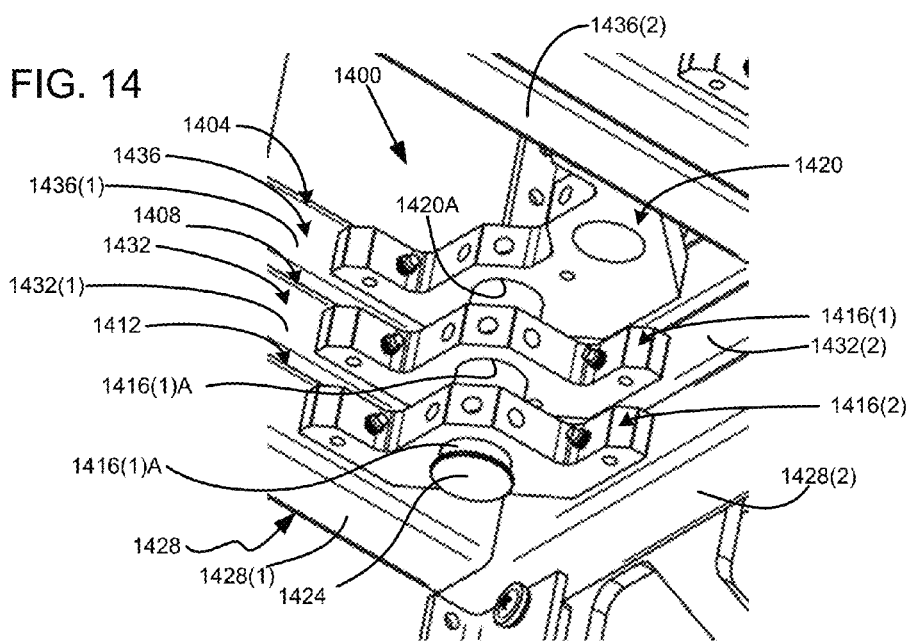
FIG. 14 is an isometric partial view of a set of three stackable modules stacked with one another, showing a double-corner-type module-connecting member, two symmetrical corner-type module-connecting members, and a connector pin secured in the pin receivers of the module-connecting members so as to at least partially secure the stackable modules together.

FIG. 14 shows an example of a connection 1400 among three stackable modules 1404, 1408, and 1412 properly stacked with one another. In the example shown, connection 1400 is formed via a pair of instantiations 1416(1) and 1416(2) of symmetrical corner-type module connection member 800 of FIG. 8, an instantiation 1420 of double-pin-receiver module connection member 1100 of FIG. 11, and a connector pin 1424, which is snugly engaged within corresponding respective connector-pin receivers 1416(1)A, 1416(2)A, and 1420A of symmetrical corner-type module connection member and double-pin-receiver instantiations 1416(1), 1416(2), and 1420. Each of instantiations 1416(1), 1416(2) is fixedly connected to corresponding frame members 1428(1), 1428(2), 1432(1), and 1432(2) of respective frames 1428 and 1432 of stackable modules 1404 and 1408 in the manner described above in connection with FIG. 8, and, similarly, instantiation 1420 is fixedly connected to frame members 1436(1) and 1436(2) of frame 1436 of stackable module 1412. In the embodiment shown in FIG. 14, connector pin 1424 is fixedly secured within connector-pin receivers 1316(1)A, 1316(2)A, and 1320A using a set of equipment rack type locking screws (not shown).

Figure 15A:
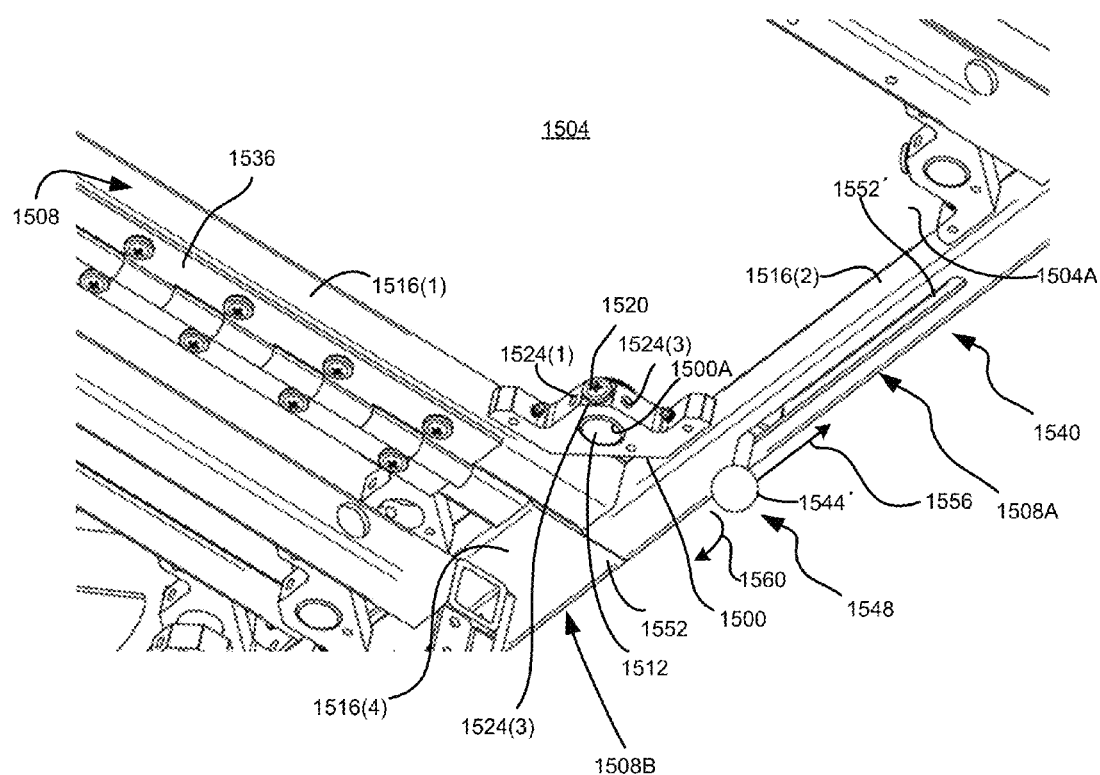
FIG. 15A is an isometric partial view of a cantilevered-support module, showing a symmetrical module-connecting member being used to secure a tabletop to a frame of the module.

FIG. 15A illustrates an instantiation 1500 of symmetrical corner-type module-connecting member 800 of FIG. 8A used to secure a tabletop 1504 to a stackable tabletop module 1508 via a connector pin 1512. In this example, instantiation 1500 is secured to frame members 1516(1) and 1516(2) of stackable tabletop module 1508 in the manner described above in connection with FIG. 8. Connector pin 1512 is secured to tabletop 1504 on its underside 1504A in a location appropriate for engaging connector-pin receiver 1500A of instantiation 1500 when the tabletop is properly located relative to stackable tabletop module 1508. Connector pin 1512 is secured in connector-pin receiver 1500A by a locking screw 1420.

Figure 15B:
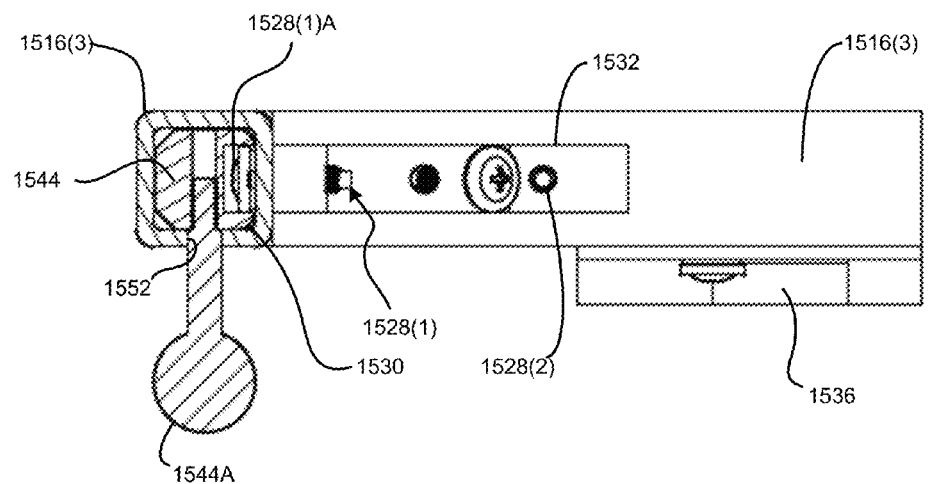
FIG. 15B is a cross-sectional view of the cantilevered portion of the cantilevered-support module of FIG. 15A taken on the lateral side of the module opposite the view of FIG. 15A and without the tabletop present.

FIG. 15B illustrates the manner in which a module-connecting member can be secured to a tubular frame member of a stackable module of the present disclosure. This manner was briefly described above in connection with FIG. 8A but is illustrated here. In FIG. 15B, it is seen that headed threaded fastener 1528(1) (a second headed threaded fastener 1528(2) is provided on the other leg of symmetrical corner-type module-connecting member instantiation 1500) has its head 1528(1)A located inside the tubular shape of frame member 1516(4). In this example, a locking washer 1532 is present between head 1528(1)A of threaded fastener 1528(1) and the wall 1516(3)A of frame member 1516(3). Not seen are one or more alignment features, that may be the same as or similar to alignment pins 826(1) and 826(2) of FIG. 8B).

FIGS. 15A and 15B also illustrate a feature that can be used with stackable tabletop modules, console-support modules, and other stackable modules having front, rear, and/or side cantilevers desired to be folded, such as for transport. As seen in FIG. 15A, tabletop module 1508 includes a cantilever portion 1508A and a base portion 1508B that is secured to one or more suitable base modules, such as one or more of base modules 108(1) and 108(2) of FIG. 1. Cantilever portion 1508A is hingedly secured to base portion 1508B, here via one or more hinges 1536, so that it can be folded from a deployed 1540 (shown in FIG. 15A) to a stowed position (not shown, but, such that, e.g., the cantilever portion hangs vertically downward relative to FIG. 15A). In the embodiment shown, cantilever portion 1508A is held in its deployed position 1540 using an internal sliding pin 1544 (FIG. 15B) that is slidable within frame member 1516(1) of the cantilever portion and, when moved to its cantilever holding position 1548 (as illustrated in FIG. 15A by the position of handle 1544A' within handle slot 1552' of frame member 1516(1)), slidable within frame member 1516(4) of base portion 1508B. (As used relative to FIGS. 15A and 15B, the prime symbol """ following an element identifier denotes that the corresponding element is identical to or a mirror image of the same element of FIG. 15B, which is a mirror image of the lateral side of tabletop module 1508 shown in FIG. 15A.)

As seen in FIG. 15B, internal sliding pin 1544 is sized to closely fit between upper and lower walls 1516(3)B and 1516(3)C of tubular frame member 1516(3) and likewise within the interior space of the aligned frame member of based portion 1508B (not seen, but the mirror image of frame member 1516(4) of FIG. 15A). In this manner, when internal sliding pin 1544 is in its cantilever-holding position 1548 and engaged within the interior spaces of the aligned frame members, including frame member 1516(3)), the internal sliding pin acts as a beam spanning the joint (similar to joint 1552 of FIG. 15A) between the frame members, preventing cantilever portion 1508A from folding at hinge(s) 1536. To fold cantilever portion 1508A to its stowed position (not shown), a user may slightly lift up on the cantilevered end (not shown) of the cantilevered portion to relieve the force of it on internal sliding pin 1544 and then slide the internal sliding pin, via handle 1544A, to its disengaged position in direction of arrow 1556 in FIG. 15A for handle 1544' so that the internal sliding pin is fully retracted into frame member 1516(3) and does not extend beyond the joint (similar to joint 1552 (FIG. 15A) on the other lateral side of cantilever portion 1508A). This process is repeated for each other internal sliding member provided to cantilever portion 1508A, and once internal sliding pin 1544 and each other internal sliding pin have been retracted, the user may pivot cantilever portion 1508A about hinge 1536 in the direction of arrow 1560 (FIG. 15A) to its stowed position. This procedure may generally be repeated in the opposite direction to move cantilever portion 1508A from its stowed position to its deployed, in-use, position.

Figure 16A:
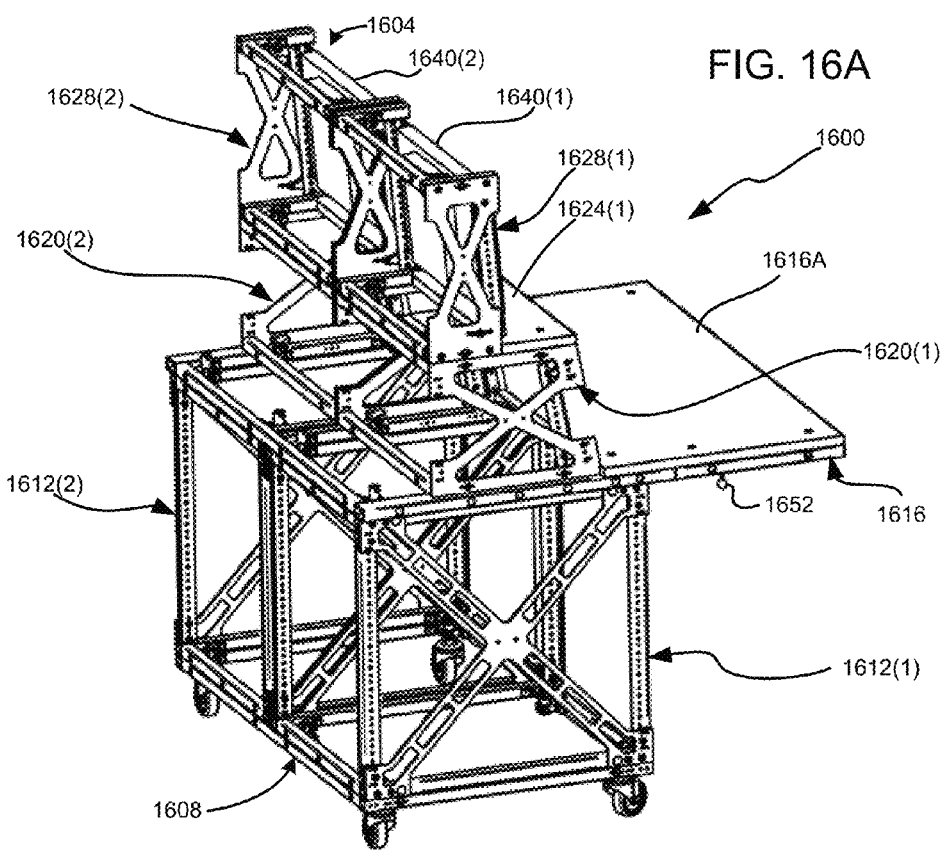
FIG. 16A is an elevational end view of a piece of module production furniture having a monitor module in a deployed location.
Figure 16B:
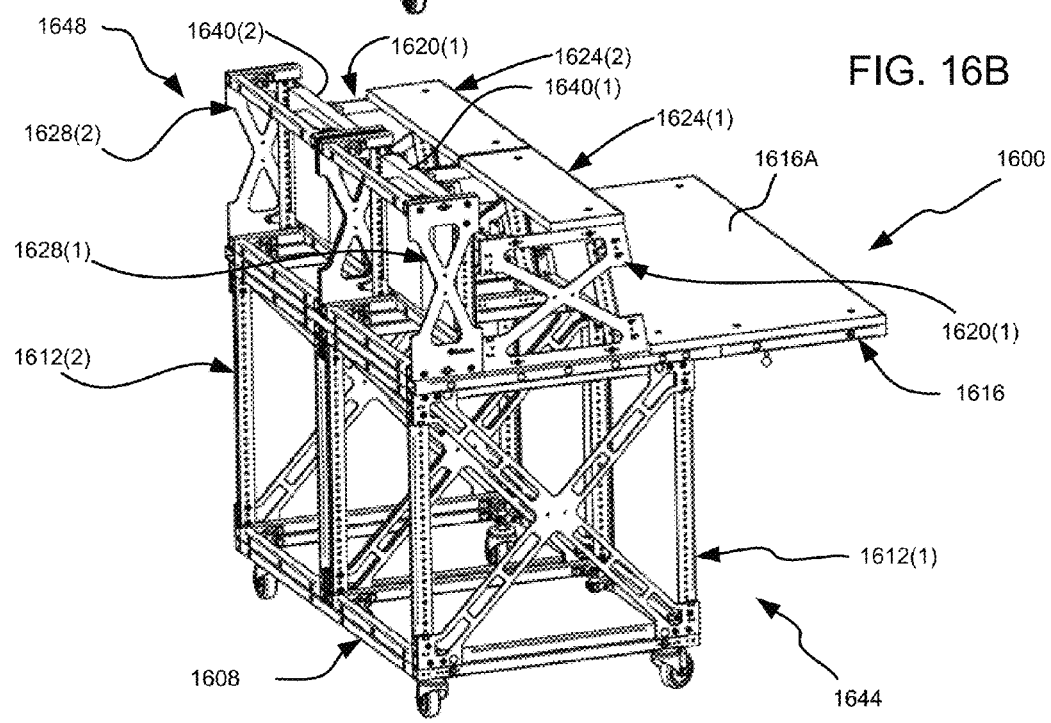
FIG. 16B is an elevational end view of the piece of modular production furniture of FIG. 16A having the monitor module in a shipping location.

FIGS. 16A and 16B illustrate an exemplary piece 1600 of modular production furniture having a configuration that allows several of its components to be readily stowed for shipping. Referring first to FIG. 16A, which illustrates piece 1600 of modular production furniture in its in-use configuration 1604, the piece of modular production furniture includes, from bottom to top, a dolly module 1608, a pair of base modules 1612(1) and 1612(2), a "double-wide" cantilevered tabletop module 1616 (i.e., it is generally as wide as two side-by-side base modules), a pair of medium-rise equipment modules 1620(1) and 1620(2), a pair of shelf modules 1624(1) and 1624(2), and a pair of small-monitor modules 1628(1) and 1628(2).

Each base module 1612(1) and 1612(2) is secured to dolly module 1608 using module-connecting members (not shown) and connector pins the same as or similar to any one or more of module-connecting members 140, 144, and 148 and pins 152 described above in connection with FIG. 1. In similar manners cantilevered tabletop module 1616 is secured to base modules 1612(1) and 1612(2), tabletop 1616A is secured to the cantilevered tabletop module, mid-rise equipment modules 1620(1) and 1620(2) are secured to the cantilevered tabletop module and/or base modules 1612 (10 and 1612(2), shelf modules 1624(1) and 1624(2) are secured to the mid-rise equipment modules, and small-monitor modules 1628(1) and 1628(2) are secured to the mid-rise equipment modules. In the example shown, piece 1600 of modular production furniture contains and/or supports several pieces of production equipment, such as a control console (not shown), controller/communications equipment (not shown) and a pair of small display monitors 1640(1) and 1640(2). When in in-use configuration 1604, piece 1600 of modular production furniture is fully functional for use when connected to a power source and other components in a full production setup.

FIG. 16B illustrates piece 1600 of modular production furniture partially in a shipping configuration 1644 in which each small-monitor module 1828 is located in a stowed position 1648 behind the corresponding mid-rise equipment modules 1620. It is noted that tabletop 1616A of tabletop module 1616 will be folded downward into a stowed position (not shown) when piece 1600 of modular production furniture is in shipping configuration 1644. Shipping configuration 1644 minimizes the size of piece 1600 of modular production furniture for shipping and handling purposes while keeping all of modules 1608, 1612(1), 1612(2), 1616, 1620(1), 1620(2), 1624(1), 1614(2), 1628(1), and 1628(2) together for easy setup into in-use configuration 1604 (FIG. 16A). Importantly, it is noted that except for the removal of control console 1640 (FIG. 16A) (which, e.g., may be packed in its own shipping container), the remaining electronic equipment, here small display monitors 1640(1) and 1640(2) and any controller/communications equipment, remains in place within the corresponding respective small-monitor and base modules 1628(1), 1628(2), 1612(1), and 1612(2), respectively, in shipping configuration 1644. This minimizes the amount of work needed to put piece 1600 of modular production furniture into its in-use configuration 1604 seen in FIG. 16A.

In this example, tabletop 1616A may be foldable in the manner described above in connection with FIGS. 15A and 15B, as evidenced by handle 1652, which corresponds to handle 1544A of FIGS. 15A and 15B. When in stowed position 1648, each small-monitor module 1628 is secured to the corresponding tabletop module 1616 and/or base module 1612 using short or long connector pins and double or triple connections as depicted, for example, in FIGS. 12 and 14.

Figure 17:
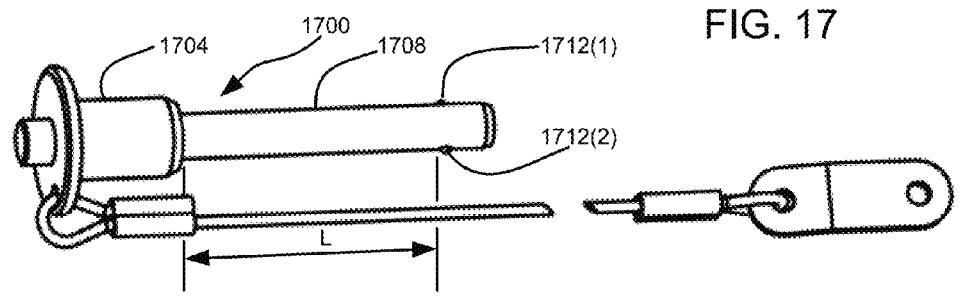
FIG. 17 is view of an alternative connector pin having a push-pin type integrated stop for securing the pin in place when engaged with a set of connection members of the present disclosure.

FIG. 17 illustrates an exemplary alternative connector pin 1700 that can be used in place of any one of pins 152, 1216, 1324, and 1424 illustrated in FIGS. 1, 12, 13, and 14, respectively. In this example, connector pin 1700 has a head 1704 and a shaft 1708 sized to snugly engage the corresponding connector-pin receivers (not shown, but the same as or similar to, e.g., connector-pin receivers 1212(1)A and 1212(2)A of module-connecting members 1212(1) and 1212 (2) of FIG. 12) so as to minimize the amount of lateral movement between the stackable modules (not shown, but the same as or similar to any of the stackable modules described above, such as stackable modules 104, 108(1), 108(2), 112, 116(1), 116(2), 120(1), 120(2), and 124 of FIGS. 1-7). In the embodiment shown, connector pin 1700 includes an integrated stop, here spring-loaded push pins 1712(1) and 1712(2), that keeps the connector pin from being disengaged from the connector-pin receivers in which it is engaged. Connector pin 1700 shown is designed for use with two module-connecting members of a corresponding pair of stackable modules stacked directly one on top of the other, with the length, L, of shaft 1708 being slightly greater than the distance between the upper surface of the upper module-connecting member (against which head 1704 rests) and the lower surface of the lower module-connecting member (below which integrated push pins 1712(1) and 1712(2) sit). In this manner, length L, when the connector pin is fully engaged with the two module-connecting members, allows for very little play between the connector pin and module-connecting members in the vertical direction to maximize stability of the stacked modules. Other similar connector pins can be provided with other lengths L to accommodate other distances between module-connecting members, such as in the 3-module-connection-member arrangement illustrated in FIG. 14. In other embodiments, the integrated stop may be of a type other than a spring-biased push pin type, such as a cotter pin type. For embodiments of modular production furniture that utilized connector pins having integrated stops, the corresponding module-connecting members need not have threaded locking-screw apertures (see, e.g., threaded locking-screw apertures 824(1) and 824(2) of FIG. 8) for rack screws or other type of locking screws. However, locking-screw apertures can be provided and used, for example, if additional stability is required, such as in multilevel monitor structures where no motion between adjacent stacked modules can be tolerated.

Figure 18:
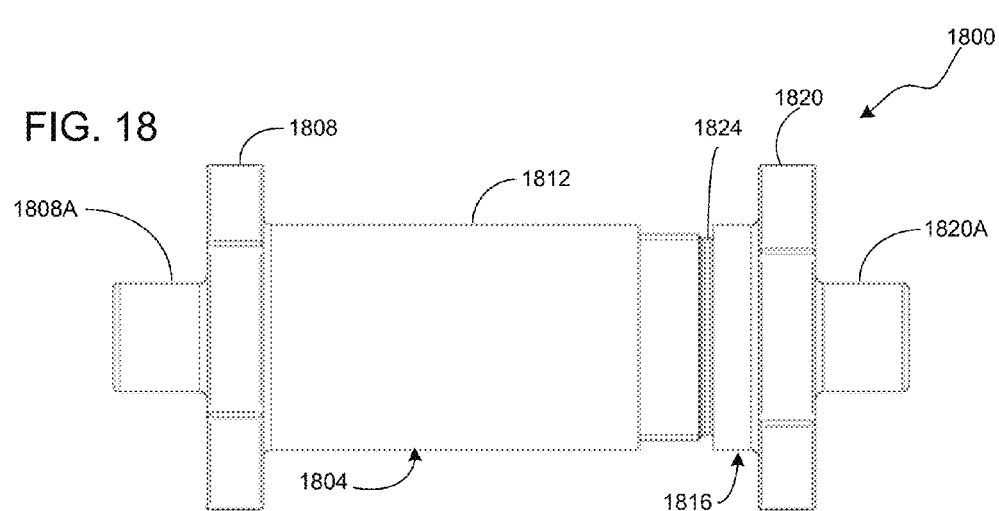
FIG. 18 is a view of another alternative connector pin having a pair of parts that threadedly engage one another to secure the pin in place when engaged with a set of connection members of the present disclosure.

FIG. 18 illustrates another exemplary connector pin 1800 that can be used in place of any of connector pins 152, 1216, 1324, 1424, and 1700 of FIGS. 1, 12, 13, 14, and 17, respectively. In the example shown in FIG. 18, connector pin 1800 comprises two primary parts, a first part 1804 that includes a head 1808 and an internally threaded shaft 1812 and a second part 1816 that includes a head 1820 and an externally threaded shaft 1824 designed and configured to threadedly engage shaft 1812 of first part 1804. In this example, each of heads 1808 and 1820 includes a grip 1808A and 1820A that allows a user to grip the corresponding one of first and second parts 1804 and 1816 during installation and removal of connector pin 1800. Shaft 1812 of first part 1804 has an outside diameter, OD, selected to snugly engage the connector-pin receivers of corresponding module-connecting members with which connector pin 1800 is used. In some embodiments, connector pin 1800 is configured to allow a user to draw module-connecting members (not shown) tightly together by tightening the threaded connection between first and second parts 1804 and 1816. One, the other, or each of first and second parts 1804 and 1816 may be provided with a locking-washer (not shown) or equivalent locking structure that tends to keep the threaded connection between first and second parts 1804 and 1816 from loosening.

Figure 19:
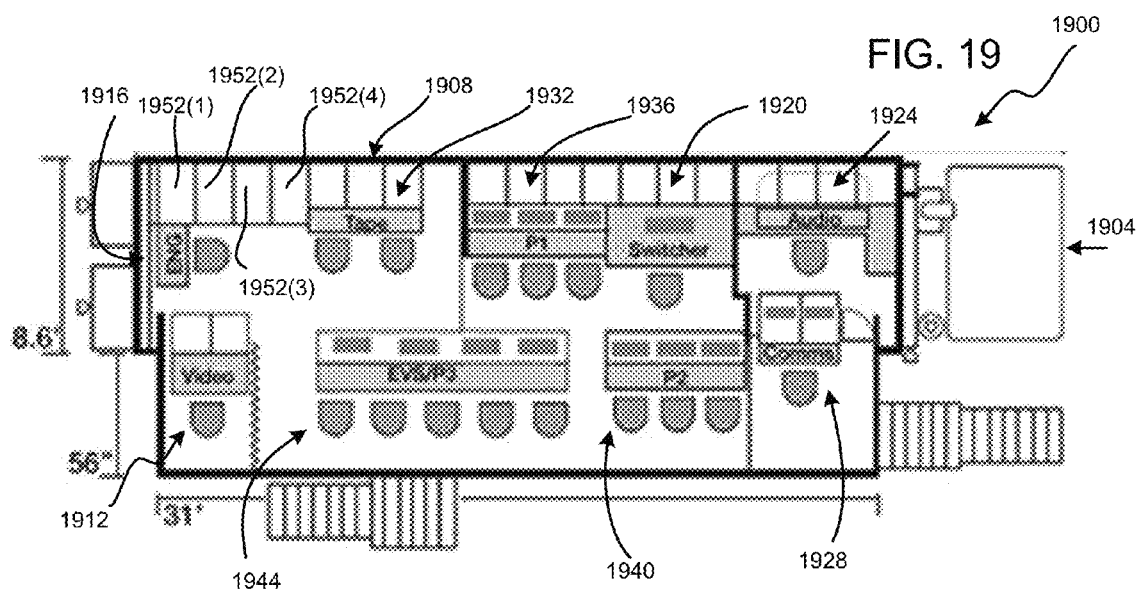
FIG. 19 is a plan view illustrating a mobile production unit containing modular production furniture of the present disclosure.

FIG. 19 illustrates an exemplary mobile production unit 1900 having a cab 1904 and a trailer or on-chassis box (generically, a "mobile enclosure" 1908) that provides a mobile production facility in which all of the electronic production equipment is supported by modular production furniture made in accordance with aspects of the present disclosure. In this example, the modular production furniture includes five single-operator modular workstations 1912, 1916, 1920, 1924, and 1928 four multi-operator modular workstations 1932, 1936, 1940, and 1944, and modular equipment racks 1952(1) to 1952(4). Each of these pieces 1912 to 1952(4) of modular production furniture is made of stackable modules that same as or similar to the various modules described herein, such as stackable modules 104, 108(1), 108(2), 112, 116(1), 116(2), 120(1), 120(2), and 124 of FIGS. 1-7. As seen in FIGS. 1-7, such stackable modules are largely open to the interior volume of mobile production unit 1900. As described above, having such wide-open modular production furniture provides a variety of benefits, such as increased air flow to electronic equipment and relative ease of manufacturing the mobile production unit, especially the open-frame support structures are made of stackable modules made in accordance with the present disclosure. Those skilled in the art will readily appreciate that similar benefits can accrue for modular production furniture in non-mobile production facilities as well.

While the openness of modular equipment furniture of the present disclosure can be a relative term, in the context of this disclosure and appended claims, "openness" is measured on each side, front, back, top, and bottom by projecting a silhouette of that portion of a module or entire support structure (e.g., rack, workstation, etc.) onto a planar surface, drawing the simplest polygon possible that closely encloses that silhouette, calculating the total area enclosed by that polygon, calculating the total of the lit (i.e., no shadowed) area(s) of the silhouette, and expressing the openness as a ratio of the total lit area to the total enclosed area. As an example, for the front and back of the base module of FIG. 1, wherein the module has an overall height of 32" and an overall width of 32" and is constructed of 1"×1" square tubes, the openness is (30"×30")/((32"×32")×100=88%. As another example, for the sides having X-bracing that is three inches wide, with the module having a depth of 32", the openness is very roughly (26"×26")/((32"×32")×100=66%. Other ones of exemplary stackable modules presented herein, such as in FIGS. 1-7, will have other opennesses, ranging from about 20% to 90% or more. In general, the openness of any particular side or other face of a stackable module is defined by the open regions between and/or within elongate structural members, typically vertical members, horizontal members, diagonal members, and/or knee braces. Such structural members are distinguishable from panels used in conventional support structures for mobile production units to enclose at least the sides and fronts of those units. In addition, it is noted that openness for the purposes herein is measured at the relevant portion of the frame. For example, a piece of front mounted electrical equipment mounted in a base module decreases the openness of the front of the module, but, unless that equipment extends all the way to the rear of the module, does not decrease the openness of any other exterior face of the module. For a complete support structure, openness can be expressed in terms of overall openness for a particular exterior face of the support structure, such as the overall side openness, overall rear openness, and overall front openness. As the modifier "overall" implies, the overall openness in the context of a modular support structure is the sum of the relevant openness of all of the faces of the stackable modules forming the relevant face of the support structure.

Figure 20:
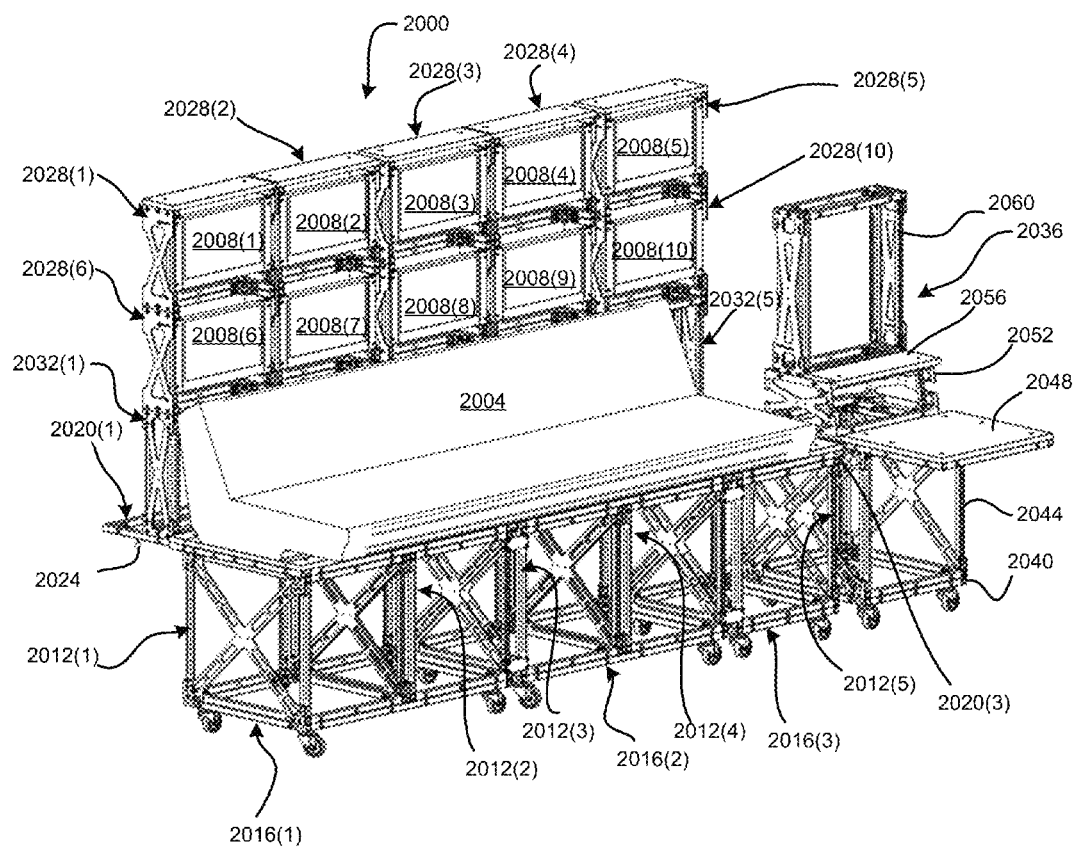
FIG. 20 is an isometric view of another exemplary piece of modular production furniture of the present disclosure.

FIG. 20 illustrates an exemplary piece of modular production furniture configured as a console/monitor workstation 2000 that includes an electronics console 2004 and ten small display monitors 2008(1) to 2008(10). In this example, workstation includes five base modules 2012(1) to 2012(5) supported on three dolly modules 2016(1) to 2016(3), two of which (2016(1) and 2016(2)) are double-wide dolly modules and one of which (2016(3)) is a single-wide dolly module. Atop based modules 2012(1) to 2012(5) sits three rear-cantilever tabletop modules 2020(1) to 2020(3) (not all labeled), two of which (2020(1) and 2020(2)) are double-wide tabletop modules and one of which (2020(3)) is a single-wide tabletop module. Each tabletop module 2020(1) to 2020(3) is of the folding type as suggested by slide 2024, which allows the rear cantilevered portions to be folded down in a manner similar to the manner described above in connection with FIGS. 15A and 15B. Cantilevered portions 2020(1)A to 2020(3)A support ten small-monitor modules 2028(1) to 2028(10) (only some labeled) and five monitor-riser modules 2032(1) to 2032(5) (only some labeled) that elevate display monitors 2008(1) to 2008(10) above the back of electronics console 2004. Modular console/monitor workstation 2000 is shown simply to illustrate the flexible configurability of modular production furniture made in accordance with aspects of the present invention.

FIG. 20 also illustrates another piece of modular production furniture 2036 that includes a dolly module 2040, a base module 2044, a front-cantilever tabletop module 2048, a low-rise equipment module 2052, a shelf module 2056, and a medium-monitor module 2060. Although not described in detail, the various modules shown in FIG. 20 are connected to one another using module-connection members and connector pins shown for example, in FIGS. 1-14 described above.

Figure 21A:
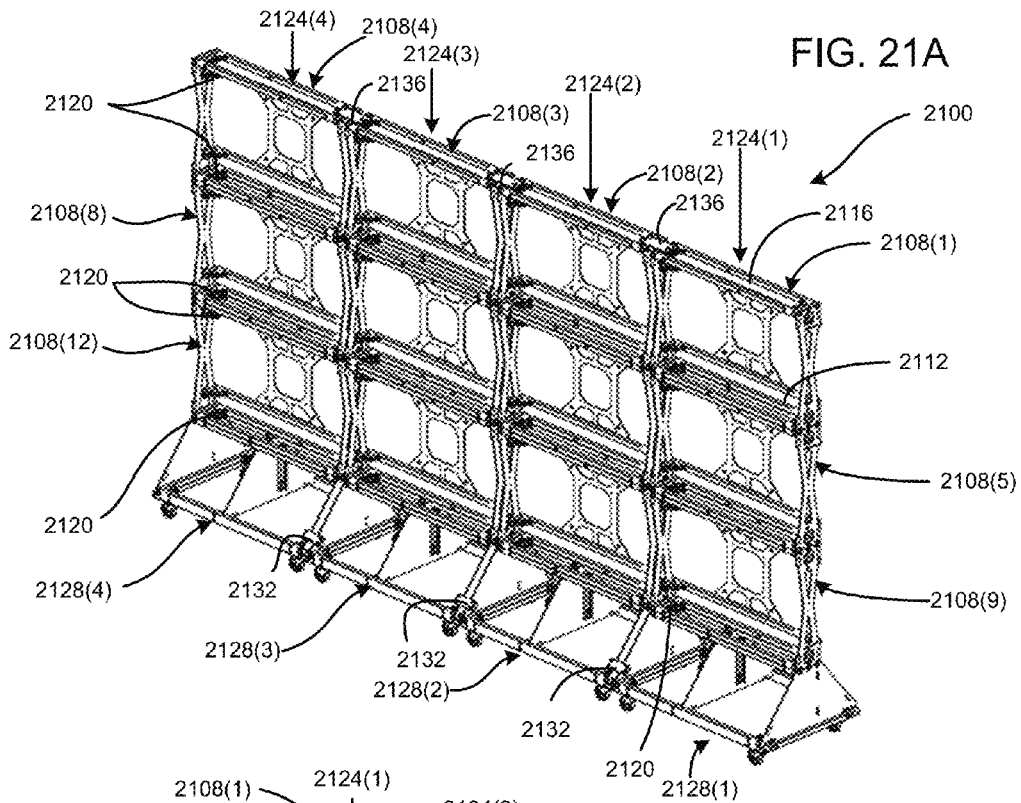
FIG. 21A is an isometric rear view of a piece of modular production furniture configured as a movable monitor wall, showing the monitor wall without display monitors.
Figure 21B:
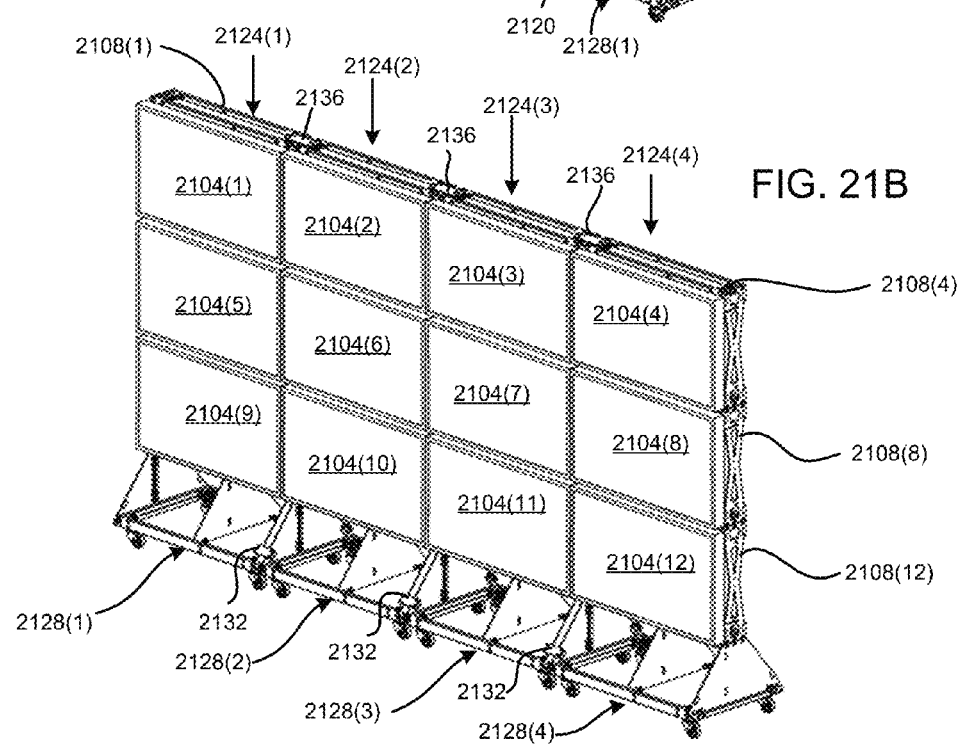
FIG. 21B is an isometric front view of the movable monitor wall of FIG. 21A, showing display monitors attached to the monitor modules.

FIGS. 21A and 21B illustrate a piece of modular production furniture configured as a movable monitor wall 2100, here supporting twelve video monitors 2104(1) to 2104(12) (FIG. 21B). As seen in FIG. 21A, monitor wall 2100 includes twelve monitor modules 2108(1) to 2108(12) (not all labeled to avoid clutter), each of which, for example, may be the same as or similar to large-monitor module 124 of FIGS. 1 and 7. In the example shown, each monitor module 2108(1) to 2108(12) is different from large-monitor module of FIGS. 1 and 7 in that each monitor module 2108(1) to 2108(12) has four-member rectangular lower and upper frames 2112 and 2116 (only one module labeled to avoid clutter), and has four double-pin-receiver module-connection members 2120 (two lower and two upper) (only a few labeled to avoid clutter). In this embodiment, each column 2124(1) to 2124(4) of three monitor modules 2108(1) to 2108(12) each is supported by a corresponding monitor-wall dolly module 2128(1) to 2128(4) that is specially designed for monitor-wall applications. To accommodate double-pin-receiver module-connection members 2120 of monitor modules 2108(1) to 2108(12), each dolly module 2128(1) to 2128(4) includes a pair of such double-pin-receiver module-connection members 2120. To unify columns 2112(1) to 2112(4) in this example, side-by-side dolly module 2128(1) to 2128(4) are connected together on each of the front and back sides with dolly connectors 2132. To stabilize columns 2128(1) to 2128(4) at their tops, side-by-side ones of top monitor modules 2108(1) to 2108(4) are connected together via lateral connectors 2136.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve various aspects of the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A modular equipment support system designed and configured to support electronic equipment, the modular equipment support system comprising:
   a plurality of stackable modules designed and configured to be contactingly stacked on, and secured to, one another to create at least one piece of production equipment furniture, each of the stackable modules including:
      a stackable frame having an upper end and a lower end, each designed and configured to contactingly engage, respectively, the lower end or the upper end of another of the stackable modules when the modules are stacked with one another;
      at least one upper module-connecting member secured to the stackable frame on the upper end, the at least one upper module-connecting member including a first connector-pin receiver designed and configured to receive a first portion of a connector pin; and
      at least one lower module-connecting member secured to the stackable frame on the lower end, the at least one lower module-connecting member including a second connector-pin receiver designed and configured to receive a second portion of the connector pin;
   wherein the stackable modules are designed and configured so that, when a first stackable module of the plurality of stackable modules is properly stacked and contactingly resting on a second stackable module of the plurality of stackable modules, the second connector-pin receiver of the first stackable module and the first connector-pin receiver of the second stackable module are in registration with one another so that a user can install, while the first stackable module is stacked and contactingly resting on the second stackable module, the connector pin so that the first and second portions of the connector pin are located, respectively, in the first and second receivers; and
   wherein the plurality of stackable modules includes a base module, a dolly module upon which at least one base module contactingly rests, a tabletop module that includes a tabletop, an equipment-support riser module, and a monitor-support module that includes a flat-panel support member designed and configured so that a flat-panel display can be mounted to the monitor-support module.

2. A modular equipment support system according to claim wherein:
   the dolly module includes a first set of module-connecting members;
   the base module includes:
      a lower end having a second set of module-connecting members designed, configured, and located for securing the base module to the dolly module using a first set of connector pins engaged between ones of the second and first sets of module-connecting members; and
      an upper end having a third set of module-connecting members;
   the tabletop module includes:
      a fourth set of module-connecting members designed, configured, and located for securing the tabletop module to the base module using a second set of connector pins engaged between ones of the fourth and corresponding ones of third sets of module-connecting members;
   the equipment-support riser module includes:
      a lower end having a fifth set of module-connecting members designed, configured, and located for securing the equipment-support riser module to the tabletop module and/or the base module using either a scenario 1 in which the second set of connector pins engaged between ones of the fifth set of module-connecting members and corresponding ones of the fourth and/or third sets of module-connecting members or a scenario 2 in which a third set of connector pins engaged between ones of the fifth set of module-connecting members and corresponding ones of the fourth and/or third sets of module-connecting members, or a combination of scenario 1 and scenario 2; and
      an upper end having a sixth set of module-connecting members; and
   the monitor-support module includes:
      a lower end having a seventh set of module-connecting members designed, configured, and located for securing the monitor support module to the equipment-support riser module using a fourth set of connector pins engaged between ones of the seventh set of module-connecting members and corresponding ones of the sixth set of module-connecting members; and
      an upper end having an eighth set of module-connecting members;
      wherein each of the first, second, third, fourth, fifth, sixth, seventh, and eighth sets of module-connecting members includes the at least one upper module-connecting member and the at least one lower module-connecting member of the corresponding stackable module of the plurality of stackable modules.

3. A modular equipment support system according to claim 2, wherein each of the first set of connector pins is an integral part of a caster used to secure the caster to at least the dolly module.

4. A modular equipment support system according to claim 2, wherein at least the tabletop module, the monitor-support module, and the equipment-support riser module are each designed and configured so that when the equipment-support riser module is deployed for use atop the tabletop module, the monitor-support module can be secured to the equipment-support riser module in an in-use position atop the equipment-support riser module and secured to the tabletop module in a stowed position laterally adjacent to the equipment-support riser module.

5. A modular equipment support system according to claim 4, wherein the monitor-support module and the equipment-support riser module are each designed and configured so that electronic equipment installed therein can remain installed in both the in-use position and the stowed position.

6. A modular equipment support system designed and configured to support electronic equipment, the modular equipment support system comprising:
a plurality of stackable modules designed and configured to be contactingly stacked on, and secured to, one another to create at least one piece of production equipment furniture, each of the stackable modules including:
a stackable frame having an upper end and lower end, each designed and configured to contactingly engage, respectively, the lower end or the upper end of another of the stackable modules when the modules are stacked with one another;
at least one upper module-connecting member secured to the stackable frame on the upper end, the at least one upper module-connecting member including a first connector-pin receiver designed and configured to receive a first portion of a connector pin; and
at least one lower module-connecting member secured to the stackable frame on the lower end, the at least one lower module-connecting member including a second connector-pin receiver designed and configured to receive a second portion of the connector pin;
wherein the stackable modules are designed and configured so that, when a first stackable module of the plurality of stackable modules is properly stacked and contactingly resting on a second stackable module of the plurality of stackable modules, the second connector-pin receiver of the first stackable module and the first connector-pin receiver of the second stackable module are in registration with one another so that a user can install, while the first stackable module is stacked and contactingly resting on the second stackable module, the connector pin so that the first and second portions of the connector pin are located, respectively, in the first and second receivers; and
wherein the plurality of stackable modules includes a base module and an equipment-support riser module designed and configured to be stacked on and coupled to the base module, the base module having a first depth and the equipment support module having a second depth less than the first depth, wherein each of the first and second depths are in a horizontal direction when the base module and the equipment support module are deployed for use.

7. A modular equipment support system according to claim 6, further comprising a monitor-support module designed and configured to be contactingly stacked on and secured to the equipment-support riser module using at least one connector pin after the monitor-support module has been contactingly stacked on the equipment-support riser.

8. A modular equipment support system according to claim 7, wherein the monitor-support module has a third depth that is less than a difference between the first and second depths so that the monitor-support module and the equipment-support riser module can be simultaneously secured to the base module in positions laterally adjacent to one another using a set of connector pins after each of the monitor-support and equipment-support riser modules have been contactingly stacked on the base module.

9. A modular equipment support system designed and configured to support electronic equipment, the modular equipment support system comprising:
a plurality of stackable modules designed and configured to be contactingly stacked on, and secured to, one another to create at least one piece of production equipment furniture, each of the stackable modules including:
a stackable frame having an upper end and lower end, each designed and configured to contactingly engage, respectively, the lower end or the upper end of another of the stackable modules when the modules are stacked with one another;
at least one upper module-connecting member secured to the stackable frame on the upper end, the at least one upper module-connecting member including a first connector-pin receiver designed and configured to receive a first portion of a connector pin; and
at least one lower module-connecting member secured to the stackable frame on the lower end, the at least one lower module-connecting member including a second connector-pin receiver designed and configured to receive a second portion of the connector pin;
wherein the stackable modules are designed and configured so that, when a first stackable module of the plurality of stackable modules is properly stacked and contactingly resting on a second stackable module of the plurality of stackable modules, the second connector-pin receiver of the first stackable module and the first connector-pin receiver of the second stackable module are in registration with one another so that a user can install, while the first stackable module is stacked and contactingly resting on the second stackable module, the connector pin so that the first and second portions of the connector pin are located, respectively, in the first and second receivers;
further comprising a plurality of connector pins each designed and configured for snugly engaging the first and second connector-pin receivers when in registration with one another; and
wherein each of the upper and lower module-connecting members includes at least one threaded locking-screw aperture designed and configured to receive a locking screw for securing a connector pin in the corresponding one of the first and second connector-pin receivers.

10. A modular equipment support system according to claim 9, wherein each threaded locking-screw aperture is tapped for an electronic equipment rack screw.

11. A modular equipment support system designed and configured to support electronic equipment, the modular equipment support system comprising:
a plurality of stackable modules designed and configured to be contactingly stacked on, and secured to, one another to create at least one piece of production equipment furniture, each of the stackable modules including:
a stackable frame having an upper end and lower end, each designed and configured to contactingly engage, respectively, the lower end or the upper end of another of the stackable modules when the modules are stacked with one another;
at least one upper module-connecting member secured to the stackable frame on the upper end, the at least one upper module-connecting member including a first connector-pin receiver designed and configured to receive a first portion of a connector pin; and at least one lower module-connecting member secured to the stackable frame on the lower end, the at least one lower module-connecting member including a second connector-pin receiver designed and configured to receive a second portion of the connector pin;

wherein the stackable modules are designed and configured so that, when a first stackable module of the plurality of stackable modules is properly stacked and contactingly resting on a second stackable module of the plurality of stackable modules, the second connector-pin receiver of the first stackable module and the first connector-pin receiver of the second stackable module are in registration with one another so that a user can install, while the first stackable module is stacked and contactingly resting on the second stackable module, the connector pin so that the first and second portions of the connector pin are located, respectively, in the first and second receivers; and wherein, for at least one of the plurality of stackable modules, a pair of frame members at the upper end of the stackable frame form a first reentrant corner, the at least one upper module-connecting member secured in the first reentrant corner directly to each of frame members in the pair so that opposite ends of the at least one upper module-connecting member are directly connected to corresponding respective ones of the frame members in the pair; and wherein the reentrant corner forms an interior angle, and the at least one upper module-connecting member is a symmetrical corner-type module-connecting member that is symmetrical about a plane of symmetry that bisects the interior angle.

12. A modular equipment support system designed and configured to support electronic equipment, the modular equipment support system comprising:

a plurality of stackable modules designed and configured to be contactingly stacked on, and secured to, one another to create at least one piece of production equipment furniture, each of the stackable modules including:
  a stackable frame having an upper end and lower end, each designed and configured to contactingly engage, respectively, the lower end or the upper end of another of the stackable modules when the modules are stacked with one another;
  at least one upper module-connecting member secured to the stackable frame on the upper end, the at least one upper module-connecting member including a first connector-pin receiver designed and configured to receive a first portion of a connector pin; and
  at least one lower module-connecting member secured to the stackable frame on the lower end, the at least one lower module-connecting member including a second connector-pin receiver designed and configured to receive a second portion of the connector pin;

wherein the stackable modules are designed and configured so that, when a first stackable module of the plurality of stackable modules is properly stacked and contactingly resting on a second stackable module of the plurality of stackable modules, the second connector-pin receiver of the first stackable module and the first connector-pin receiver of the second stackable module are in registration with one another so that a user can install, while the first stackable module is stacked and contactingly resting on the second stackable module, the connector pin so that the first and second portions of the connector pin are located, respectively, in the first and second receivers;

wherein, for at least one of the plurality of stackable modules, a pair of frame members at the upper end of the stackable frame form a first reentrant corner, the at least one upper module-connecting member secured in the first reentrant corner directly to each of frame members in the pair so that opposite ends of the at least one upper module-connecting member are directly connected to corresponding respective ones of the frame members in the pair; and wherein the reentrant corner forms an interior angle, and the at least one upper module-connecting member is an asymmetrical corner-type module-connecting member that is symmetrical about a plane of symmetry that bisects the interior angle.

13. A modular equipment support system according to claim 1, wherein, for at least one of the plurality of stackable modules, a pair of frame members at the upper end of the stackable frame form a first reentrant corner, the at least one upper module-connecting member being an intermediate-type module-connecting member secured to one or the other of the pair of frame members.

14. A modular equipment support system according to claim 1, wherein, for at least one of the plurality of stackable modules, a set of frame members at the upper end of the stackable frame form a pair of adjacent reentrant corners, the at least one upper-module connecting member being a double-pin-receiver module-connecting member.

15. The module equipment support system according to claim 1, wherein each of the plurality of stackable modules defines an interior space bounded by the stackable frame, and each of the at least one upper module-connecting member and each of the at least one lower-module-connecting member is located in the interior space.

16. The module equipment support system according to claim 1, wherein, when the first stackable module is contactingly resting on the second stackable module and the connector pin is located in the first and second receivers, the at least one lower module-connecting member of the first stackable module is spaced from the at least one upper module-connecting member of the second stackable module.

* * * * *

UNITED STATES PATENT AND TRADEMARK OFFICE
CERTIFICATE OF CORRECTION

PATENT NO. : 9,924,613 B2
APPLICATION NO. : 15/148829
DATED : March 20, 2018
INVENTOR(S) : Vincent M. Pace and Patrick Campbell It is certified that error appears in the above-identified patent and that said Letters Patent is hereby corrected as shown below:

In Column 26, Claim 2, Line 2, the number --1-- should be inserted after the word "claim", therefor.

In Column 28, Claim 9, Line 9, the letter --a-- should be inserted after the word "and", therefor.

In Column 28, Claim 11, Line 58, the letter --a-- should be inserted after the word "and", therefor.

In Column 29, Claim 12, Line 41, the letter --a-- should be inserted after the word "and", therefor.

Signed and Sealed this
Eighteenth Day of September, 2018

Andrei Iancu
*Director of the United States Patent and Trademark Office*